(12) United States Patent
Kandel et al.

(10) Patent No.: US 11,372,340 B2
(45) Date of Patent: Jun. 28, 2022

(54) METHOD AND SYSTEM FOR PROVIDING A QUALITY METRIC FOR IMPROVED PROCESS CONTROL

(75) Inventors: Daniel Kandel, Aseret (IL); Guy Cohen, Yaad (IL); Dana Klein, Haifa (IL); Vladimir Levinski, Nazareth Ilit (IL); Noam Sapiens, Bat Yam (IL); Alex Shulman, Migdal Haemek (IL); Vladimir Kamenetsky, Migdal Haemek (IL); Eran Amit, Migdal Haemek (IL); Irina Vakshtein, Migdal Haemek (IL)

(73) Assignee: KLA Corporation, Milpitas, CA (US)

( * ) Notice: Subject to any disclaimer, the term of this patent is extended or adjusted under 35 U.S.C. 154(b) by 1219 days.

(21) Appl. No.: 13/508,495

(22) PCT Filed: Apr. 4, 2012

(86) PCT No.: PCT/US2012/032169
§ 371 (c)(1),
(2), (4) Date: May 7, 2012

(87) PCT Pub. No.: WO2012/138758
PCT Pub. Date: Oct. 11, 2012

(65) Prior Publication Data
US 2013/0035888 A1 Feb. 7, 2013

Related U.S. Application Data

(60) Provisional application No. 61/598,140, filed on Feb. 13, 2012, provisional application No. 61/597,504, (Continued)

(51) Int. Cl.
*G03F 7/20* (2006.01)
*G03F 1/48* (2012.01)

(52) U.S. Cl.
CPC ........... *G03F 7/70633* (2013.01); *G03F 1/48* (2013.01); *G03F 7/70616* (2013.01); *G01N 2223/6116* (2013.01)

(58) Field of Classification Search
CPC .............................. G03F 7/70633; G03F 1/48
(Continued)

(56) References Cited

U.S. PATENT DOCUMENTS 7,068,833 B1 * 6/2006 Ghinovker .......... G03F 7/70633
382/143
7,876,438 B2 1/2011 Ghinovker et al.
(Continued)

FOREIGN PATENT DOCUMENTS

| JP | 2005-529488 A | 9/2005 |
|----|---------------|--------|
| JP | 2007-527531 A | 9/2007 |
| WO | 2003104929 A2 | 12/2003 |

OTHER PUBLICATIONS

Daniel Kandel et al., "Overlay accuracy fundamentals", Proceedings of SPIE, vol. 8324, Mar. 29, 2012, p. 832417-1 to 832417-10, XP055133819, ISSN: 0277-786x, DOI: 10.1117/12.916369.
(Continued)

*Primary Examiner* — Eman A Alkafawi
(74) *Attorney, Agent, or Firm* — Suiter Swantz pc llo

(57) ABSTRACT

The present invention may include acquiring a plurality of overlay metrology measurement signals from a plurality of metrology targets distributed across one or more fields of a wafer of a lot of wafers, determining a plurality of overlay estimates for each of the plurality of overlay metrology measurement signals using a plurality of overlay algorithms, generating a plurality of overlay estimate distributions, and generating a first plurality of quality metrics utilizing the generated plurality of overlay estimate distributions, wherein each quality metric corresponds with one overlay estimate distribution of the generated plurality of overlay (Continued)

estimate distributions, each quality metric a function of a width of a corresponding generated overlay estimate distribution, each quality metric further being a function of asymmetry present in an overlay metrology measurement signal from an associated metrology target.

22 Claims, 30 Drawing Sheets

Related U.S. Application Data filed on Feb. 10, 2012, provisional application No. 61/509,842, filed on Jul. 20, 2011, provisional application No. 61/474,167, filed on Apr. 11, 2011, provisional application No. 61/472,545, filed on Apr. 6, 2011.

(58) Field of Classification Search
USPC ........................................ 702/81, 40, 42, 179
See application file for complete search history.

(56) References Cited

U.S. PATENT DOCUMENTS

| | | | |
|---|---|---|---|
| 8,175,831 | B2 | 5/2012 | Izikson et al. |
| 2008/0094630 | A1* | 4/2008 | Mieher ................ G01N 21/956 356/401 |
| 2008/0276696 | A1 | 11/2008 | Zhou et al. |
| 2008/0286885 | A1 | 11/2008 | Izikson et al. |
| 2009/0284744 | A1* | 11/2009 | Mieher ................ G01N 21/956 356/399 |
| 2009/0303482 | A1* | 12/2009 | Levinski ........... H01L 21/67294 356/400 |
| 2010/0091284 | A1 | 4/2010 | Mieher et al. |

OTHER PUBLICATIONS

Atsushi Uneno et al., Improved overlay metrology device correlation on 90nm logic processes, Metrology, Inspection, and Process Control for Microlithography XVIII, Proceedings of SPIE vol. 5375, May 24, 2004, pp. 222-231, SPIE, Bellingham, WA.

Chris Mack, Fundamental Principles of Optical Lithography: The Science of Microfabrication, Jan. 2008, John Wiley & Sons, Ltd., pp. 297-368.

Daniel J. Coleman et al., Accuracy of overlay measurements: tool and mark asymmetry effects, Proc SPIE vol. 1261, Integrated Circuit Metrology, Inspection, and Process Control IV, pp. 139-161, Jun. 1, 1990.

Joel Seligson et al., Target Noise in overlay metrology, Metrology, Inspection, and Process Control for Microlithography XVII, Proceedings of SPIE vol. 5375, pp. 403-412, May 2004.

Mike Adel et al., Characterization of Overlay Mark Fidelity, Metrology, Inspection, and Process Control for Microlithography XVII, Proceedings of SPIE, vol. 5038, May 27, 2003, pp. 437-444.

Daniel Kandel et al., Differential Signal Scatterometry Overlay Metrology: An Accuracy Investigation, Optical Measurement Systems for Industrial Inspection V, Proc. of SPIE vol. 6616, Jun. 18, 2007, pp. 66160H-1-66160H11.

* cited by examiner

METHOD AND SYSTEM FOR PROVIDING A QUALITY METRIC FOR IMPROVED PROCESS CONTROL

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC § 119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional patent application entitled METHODS TO REDUCE SYSTEMATIC BIAS IN OVERLAY METROLOGY OR LITHOGRAPHY PROCESS CONTROL, naming Daniel Kandel, Guy Cohen, Vladimir Levinski, and Noam Sapiens as inventors, filed Apr. 6, 2011, Application Ser. No. 61/472,545.

For purposes of the USPTO extra-statutory requirements, the present application constitutes a regular (non-provisional) patent application of United States Provisional patent application entitled METHODS TO REDUCE SYSTEMATIC BIAS IN OVERLAY METROLOGY OR LITHOGRAPHY PROCESS CONTROL, naming Daniel Kandel, Guy Cohen, Vladimir Levinski, Noam Sapiens, Alex Shulman, and Vladimir Kamenetsky as inventors, filed Apr. 11, 2011, Application Ser. No. 61/474, 167.

For purposes of the USPTO extra-statutory requirements, the present application constitutes a regular (non-provisional) patent application of United States Provisional patent application entitled METHODS FOR CALCULATING CORRECTABLES WITH BETTER ACCURACY, naming Guy Cohen, Eran Amit, and Dana Klein as inventors, filed Jul. 7, 2011, Application Ser. No. 61/509,842.

For purposes of the USPTO extra-statutory requirements, the present application constitutes a regular (non-provisional) patent application of United States Provisional patent application entitled METHODS FOR CALCULATING CORRECTABLES WITH BETTER ACCURACY, naming Guy Cohen, Dana Klein, and Eran Amit as inventors, filed Feb. 10, 2012, Application Ser. No. 61/597,504.

For purposes of the USPTO extra-statutory requirements, the present application constitutes a regular (non-provisional) patent application of United States Provisional patent application entitled METHODS FOR CALCULATING CORRECTABLES USING A QUALITY METRIC, naming Daniel Kandel, Vladimir Levinski, Noam Sapiens, Guy Cohen, Dana Klein, Eran Amit, and Irina Vakshtein as inventors, filed Feb. 13, 2012, Application Ser. No. 61/598, 140.

TECHNICAL FIELD

The present invention generally relates to a method and system for providing a quality metric suitable for improving process control in a semiconductor wafer fabrication.

BACKGROUND

Fabricating semiconductor devices such as logic and memory devices typically includes processing a substrate such as a semiconductor wafer using a large number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing (CMP), etching, deposition, and ion implantation. Multiple semiconductor devices may be fabricated in an arrangement on a single semiconductor wafer and then separated into individual semiconductor devices.

Metrology processes are used at various steps during a semiconductor manufacturing process to monitor and control one or more semiconductor layer processes. For example, metrology processes are used to measure one or more characteristics of a wafer such as dimension (e.g., line width, thickness, etc.) of features formed on the wafer during a process step, wherein the quality of the process step can be determined by measuring the one or more characteristics. One such characteristic includes overlay error. An overlay measurement generally specifies how accurately a first patterned layer aligns with respect to a second patterned layer disposed above or below it or how accurately a first pattern aligns with respect to a second pattern disposed on the same layer. The overlay error is typically determined with an overlay target having structures formed on one or more layers of a work piece (e.g., semiconductor wafer). The structures may take the form of gratings, and these gratings may be periodic. If the two layers or patterns are properly formed, then the structure on one layer or pattern tends to be aligned relative to the structure on the other layer or pattern. If the two layers or patterns are not properly formed, then the structure on one layer or pattern tends to be offset or misaligned relative to the structure on the other layer or pattern. Overlay error is the misalignment between any of the patterns used at different stages of semiconductor integrated circuit manufacturing. Conventionally, understanding of the variation across die and wafer are limited to the fixed sampling and hence overlay error is detected only for the known selected sites.

Moreover, if a measured characteristic, such as overlay error, of the wafer is unacceptable (e.g., out of a predetermined range for the characteristic), the measurement of the one or more characteristics may be used to alter one or more parameters of the process such that additional wafers manufactured by the process have acceptable characteristics.

In the case of overlay error, an overlay measurement may be used to correct a lithography process in order to keep overlay errors within desired limits. For example, overlay measurements may be fed into an analysis routine that calculates "correctables" and other statistics, which may be used by the operator in order to better align the lithography tool used in the wafer processing.

Therefore, it is critical to measure overlay error of a set of metrology targets as accurately as possible. Inaccuracy in a given set of overlay metrology measurements may arise from a variety of factors. One such factor is the imperfection present in a given overlay target. Target structure asymmetry represents one of the most significant types of target imperfection leading to overlay measurement inaccuracies. Overlay target asymmetry along with the interaction of the target imperfections with the given metrology technology may lead to relatively sizeable inaccuracies in the overlay measurement. As a result, it is desirable to provide a system and method suitable for mitigating the impact of the overlay target asymmetry in one or more overlay targets of a wafer.

SUMMARY

A computer-implemented method for providing a quality metric suitable for improving process control in a semiconductor wafer fabrication is disclosed. In one aspect, a method may include, but is not limited to, acquiring a plurality of overlay metrology measurement signals from a plurality of metrology targets distributed across one or more fields of a wafer of a lot of wafers, each overlay metrology measurement signal corresponding with a metrology target of the plurality of metrology targets, the plurality of overlay metrology measurement signals acquired utilizing a first measurement recipe; determining a plurality of overlay estimates for each of the plurality of overlay metrology measurement signals by applying a plurality of overlay algorithms to each overlay metrology measurement signal, each overlay estimate determined utilizing one of the overlay algorithms; generating a plurality of overlay estimate distributions by generating an overlay estimate distribution for each of the plurality of overlay metrology measurement signals from the plurality of metrology targets utilizing the plurality of overlay estimates; and generating a first plurality of quality metrics utilizing the generated plurality of overlay estimate distributions, wherein each quality metric corresponds with one overlay estimate distribution of the generated plurality of overlay estimate distributions, each quality metric a function of a width of a corresponding generated overlay estimate distribution, each quality metric further being a function of asymmetry present in an overlay metrology measurement signal from an associated metrology target.

The method may further include: identifying one or more metrology targets of the plurality of metrology targets having a quality metric larger than a selected outlier level along at least one direction from a distribution of the plurality of quality metrics generated for the plurality of metrology targets; determining a corrected plurality of metrology targets, wherein the corrected plurality of metrology targets excludes the identified one or more metrology targets having a quality metric deviating beyond a selected outlier level from the plurality of metrology targets; and calculating a set of correctables utilizing the determined corrected plurality of metrology targets.

Additionally, the method may include: acquiring at least an additional plurality of overlay metrology measurement signals from the plurality of metrology targets distributed across the one or more fields of the wafer of the lot of wafers, each overlay metrology measurement signal of the at least an additional plurality of overlay metrology measurement signals corresponding with a metrology target of the plurality of metrology targets, the at least an additional plurality of overlay metrology measurement signals acquired utilizing at least an additional measurement recipe; determining at least an additional plurality of overlay estimates for each of the at least an additional plurality of overlay measurement signals by applying the plurality of overlay algorithms to each overlay measurement signal of the at least an additional plurality of measurement signals, each of the at least an additional plurality of overlay estimates determined utilizing one of the overlay algorithms; generating at least an additional plurality of overlay estimate distributions by generating an overlay estimate distribution for each of the at least an additional plurality of overlay measurement signals from the plurality of metrology targets utilizing the plurality of overlay estimates; and generating at least an additional plurality of quality metrics utilizing the generated at least an additional plurality of overlay estimate distributions, wherein each quality metric of the at least an additional plurality of quality metrics corresponds with one overlay estimate distribution of the generated at least an additional plurality of overlay estimate distributions, each quality metric of the at least an additional plurality of quality metrics a function of a width of a corresponding generated overlay estimate distribution of the at least an additional plurality of overlay estimate distributions; determining a process measurement recipe by comparing a distribution of the first plurality of quality metrics associated with the first measurement recipe to a distribution of the at least an additional plurality of quality metrics associated with the at least one additional measurement recipe.

In another aspect, a method may include, but is not limited to, acquiring a metrology measurement signal from one or more metrology targets of one or more fields of a wafer of a lot of wafers; determining a plurality of overlay estimates by applying a plurality of overlay algorithms to the acquired metrology measurement signal, each overlay estimate determined utilizing one of the overlay algorithms; generating an overlay estimate distribution utilizing the plurality of overlay estimates; and generating a quality metric for the one or more metrology targets utilizing the generated overlay estimate distribution, the quality metric a function of a width of the generated overlay estimate distribution, the quality metric configured to be non-zero for asymmetric overlay measurement signals, the quality metric a function of a width of the generated overlay estimate distribution, the quality metric further being a function of asymmetry present in the metrology measurement signal acquired from an associated metrology target.

A computer-implemented method for providing a set of process tool correctables is disclosed. In another aspect, a method may include, but is not limited to, acquiring an overlay metrology result for each metrology target of a plurality of metrology targets distributed across one or more fields of a wafer of a lot of wafers; acquiring a quality metric associated with each acquired overlay metrology result; determining a modified overlay value for each metrology target utilizing the acquired overlay metrology result and the associated quality metric result for each metrology target, wherein the modified overlay value for each metrology target is a function of at least one material parameter factor; calculating a set of correctables and a set of residuals corresponding with the set of correctables for a plurality of material parameter factors; determining a value of the material parameter factor suitable for at least substantially minimizing the set of residuals; and identifying a set of correctables associated with the at least substantially minimized set of residuals.

A computer-implemented method for identifying a variation in process tool correctables is disclosed. In one aspect, a method may include, but is not limited to, acquiring an overlay metrology result for each metrology target of a plurality of metrology targets distributed across one or more fields of a wafer of a lot of wafers; acquiring a quality metric associated with each acquired overlay metrology result; determining a plurality of modified overlay values for the plurality of metrology targets utilizing the acquired overlay metrology result for each metrology target and a quality function, the quality function being a function of the acquired quality metric of each metrology target; generating a plurality of sets of process tool correctables by determining a set of process tool correctables for each of a plurality of randomly selected samplings of the acquired overlay metrology results and the associated quality metrics of the plurality of metrology targets utilizing the plurality of modified overlay values, wherein each of the random samplings is of the same size; and identifying a variation in the plurality of sets of process tool correctables.

A computer-implemented method for generating a metrology sampling plan is disclosed. In one aspect, a method may include, but is not limited to, acquiring a plurality of overlay metrology measurement signals from a plurality of metrology targets distributed across one or more fields of a wafer of a lot of wafers, each overlay metrology measurement signal corresponding with a metrology target of the plurality of metrology targets; determining a plurality of overlay estimates for each of the plurality of overlay metrology measurement signals by applying a plurality of overlay algorithms to each overlay metrology measurement signal, each overlay estimate determined utilizing one of the overlay algorithms; generating a plurality of overlay estimate distributions by generating an overlay estimate distribution for each of the plurality of overlay metrology measurement signals from the plurality of metrology targets utilizing the plurality of overlay estimates; generating a first plurality of quality metrics utilizing the generated plurality of overlay estimate distributions, wherein each quality metric corresponds with one overlay estimate distribution of the generated plurality of overlay estimate distributions, each quality metric further being a function of asymmetry present in an overlay metrology measurement signal from an associated metrology target; and generating one or more metrology sampling plans utilizing the generated first plurality of quality metrics of the plurality of metrology targets.

A computer-implemented method for providing process signature mapping is disclosed. In one aspect, a method may include, but is not limited to, forming a plurality of proxy targets on a reticle; forming a plurality of device correlation targets on a wafer; determining a first process signature as a function of position across the wafer by comparing a first set of metrology results acquired from the plurality of proxy targets following a lithography process and prior to a first etching process of the wafer and at least a second set of metrology results acquired from the plurality of proxy targets following the first etching process of the wafer; correlating the first process signature with a specific process path; measuring a device correlation bias following the first etching process by performing a first set of metrology measurements on the plurality of device correlation targets of the wafer, the device correlation bias being the bias between a metrology structure and a device of the wafer; determining an additional etch signature for each additional process layer and for each additional non-lithographic process path of the wafer as a function of position across the wafer; measuring an additional device correlation bias following each additional process layer and each additional non-lithographic process path of the wafer; and generating a process signature map database utilizing the determined first etch signature and each of the additional etch signatures and the first measured device correlation bias and each additional device correlation bias.

A system for providing a quality metric suitable for improving process control in a semiconductor wafer fabrication is disclosed. In one aspect, a system may include, but is not limited to, a metrology system configured to acquire a plurality of overlay metrology measurement signals from a plurality of metrology targets distributed across one or more fields of a wafer of a lot of wafers, each overlay metrology measurement signal corresponding with a metrology target of the plurality of metrology targets, the plurality of overlay metrology measurement signals acquired utilizing a first measurement recipe; and a computing system configured to: determine a plurality of overlay estimates for each of the plurality of overlay metrology measurement signals by applying a plurality of overlay algorithms to each overlay metrology measurement signal, each overlay estimate determined utilizing one of the overlay algorithms; generate a plurality of overlay estimate distributions by generating an overlay estimate distribution for each of the plurality of overlay metrology measurement signals from the plurality of metrology targets utilizing the plurality of overlay estimates; and generate a first plurality of quality metrics utilizing the generated plurality of overlay estimate distributions, wherein each quality metric corresponds with one overlay estimate distribution of the generated plurality of overlay estimate distributions, each quality metric a function of a width of a corresponding generated overlay estimate distribution, each quality metric further being a function of asymmetry present in an overlay metrology measurement signal from an associated metrology target.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which.

DETAILED DESCRIPTION OF THE INVENTION

Figure 1B:
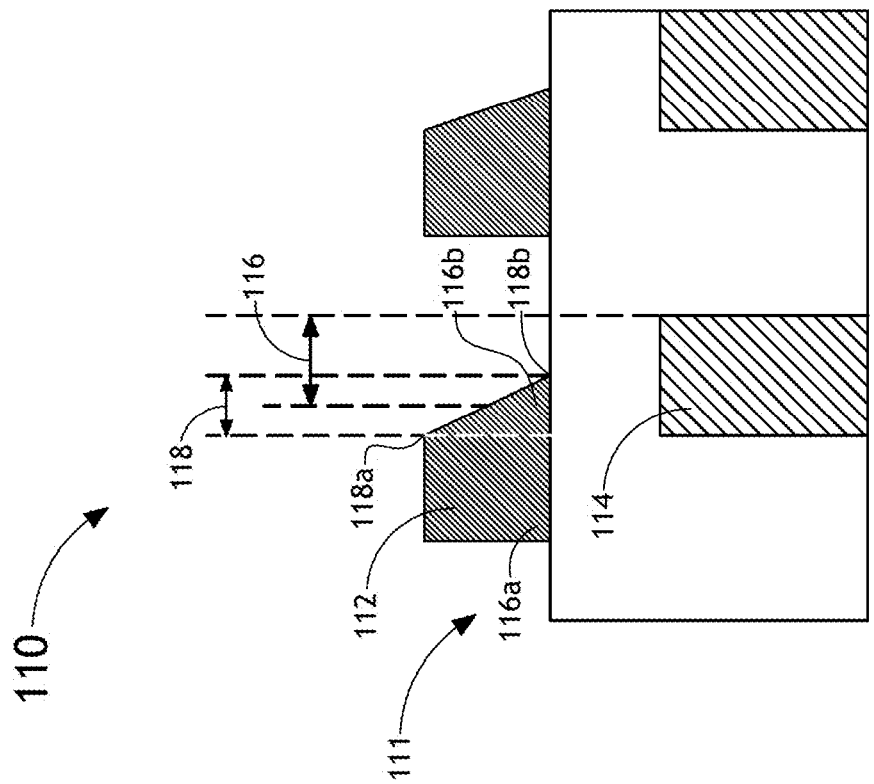
FIG. 1B illustrates a cross-sectional view of a metrology target having an asymmetric target structure, in accordance with one embodiment of the present invention.

Reference will now be made in detail to the subject matter disclosed, which is illustrated in the accompanying drawings.

Referring generally to FIGS. 1A through 19, a method and system for providing a quality metric suitable for improving process control in a semiconductor wafer fabrication process is described in accordance with the present disclosure. Overlay inaccuracy derives from a variety of factors. One such factor includes the existence of in asymmetric target structures (e.g., bottom target layer or top target layer) in one or more of a set of sampled overlay metrology targets. The presence of overlay target asymmetry may lead to geometrical ambiguity in a measurement of the given overlay target. Geometrical overlay ambiguity in turn may lead to systematic error enhancement through non-linear interaction with the overlay metrology process itself. The net effect may lead to a significant overlay inaccuracy (as large as 10 nm). The present invention is directed to a method and system for providing a quality metric configured to quantify overlay inaccuracy associated with each overlay measurement signal obtained from the various metrology targets of a sampled semiconductor wafer. The present invention is further directed to utilizing the quality metric to improve process control via outlier target removal, and metrology recipe improvement or optimization.

It is further recognized that the metrology measurements of the present invention, following quality metric generation and analysis, may then be used to calculate corrections, known as "correctables," used to correct an associated process tool used to perform a given process on the semiconductor wafer.

As used throughout the present disclosure, the term "correctable" generally refers to data that may be used to correct the alignment of a lithography tool or scanner tool to improve the control of subsequent lithographic patterning with respect to overlay performance. In a general sense, the correctables allow the wafer process to proceed within predefined desire limits by providing feedback and feedforward to improve process tool alignment.

As used throughout the present disclosure, the term "metrology scenario" refers to a specific combination of a metrology tool and a metrology target. However, within a given metrology scenario, there is a broad range of potential metrology setups under which the metrology measurement may be performed.

As used throughout the present disclosure, the term "wafer" generally refers to a substrate formed of a semiconductor or non-semiconductor material. For example, a semiconductor or non-semiconductor material include, but are not limited to, monocrystalline silicon, gallium arsenide, and indium phosphide. A wafer may include one or more layers. For example, such layers may include, but are not limited to, a resist, a dielectric material, a conductive material, and a semiconductive material. Many different types of such layers are known in the art, and the term wafer as used herein is intended to encompass a wafer on which all types of such layers may be formed.

A typical semiconductor process includes wafer processing by lot. As used herein a "lot" is a group of wafers (e.g., group of 25 wafers) which are processed together. Each wafer in the lot is comprised of many exposure fields from the lithography processing tools (e.g. steppers, scanners, etc.). Within each field may exist multiple die. A die is the functional unit which eventually becomes a single chip. On product wafers, overlay metrology targets are typically placed in the scribeline area (for example in the 4 corners of the field). This is a region that is typically free of circuitry around the perimeter of the exposure field (and outside the die). In some instances, overlay targets are placed in the streets, which are regions between the die but not at the perimeter of the field. It is fairly rare for overlay targets to be placed on product wafers within the prime die areas, as this area is critically needed for circuitry. Engineering and characterization wafers (not production wafers), however, typically have many overlay targets throughout the center of the field where no such limitations are involved.

One or more layers formed on a wafer may be patterned or unpatterned. For example, a wafer may include a plurality of dies, each having repeatable patterned features. Formation and processing of such layers of material may ultimately result in completed devices. Many different types of devices may be formed on a wafer, and the term wafer as used herein is intended to encompass a wafer on which any type of device known in the art is being fabricated.

Figure 1A:
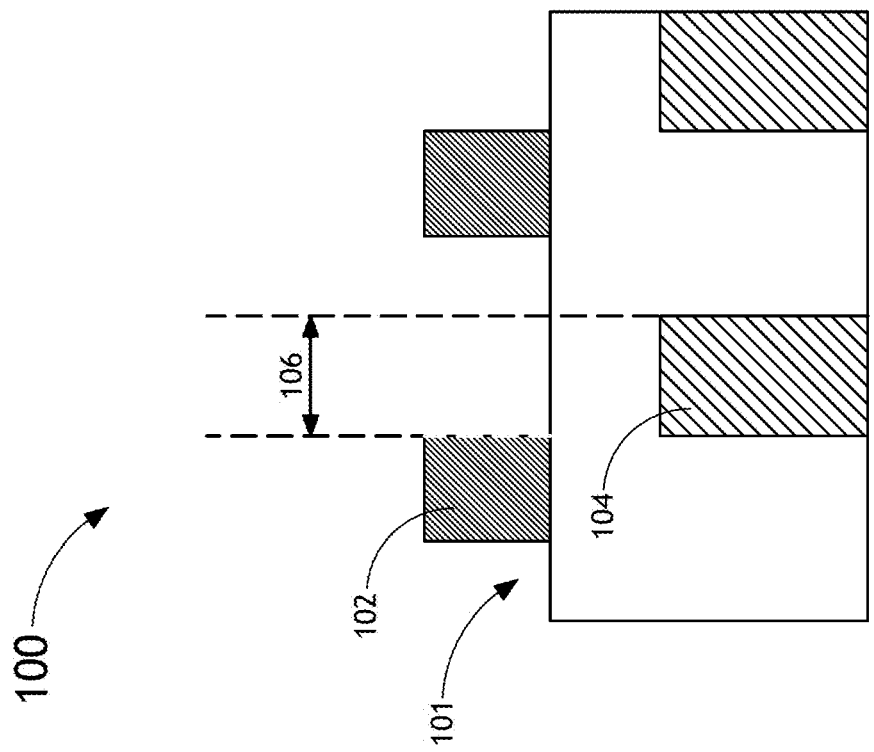
FIG. 1A illustrates a cross-sectional view of a metrology target having a symmetric target structure, in accordance with one embodiment of the present invention.

FIGS. 1A and 1B illustrate cross-sectional views of a symmetric metrology target and an asymmetric metrology target. It is recognized that the metrology targets of FIGS. 1A and 1B may include a first layer (e.g., process layer) target structure and a second layer (e.g., resist layer) target structure. For example, as shown in FIG. 1A, the overlay metrology target 100 may include a process layer structure 104 and a corresponding resist layer target structure 102. Further, due to the symmetric nature of the metrology target 100, the overlay 106 associated with the first layer (e.g., process layer) target 104 and a second layer (e.g., resist layer) target is well defined 102. As such, there is no ambiguity in a corresponding overlay metrology measurement of the idealized metrology target 100. In contrast, FIG. 1B illustrates a non-ideal metrology target 110 including a target structure 112 having a degree of asymmetry. In this sense, the target 110 includes a symmetric process layer target structure 114 and an asymmetric resist layer target structure 112. The asymmetry in the resist layer target structure 112 is created due to the wall angles 116a and 116b of the target structure 112 being non-equal (i.e., left wall angle 116a is 90° and right wall angle 116b is not equal to 90°). As a result, the process layer structure 114 of target 110 possesses a well-defined center of symmetry, while the resist layer structure 112 of target 110 lacks a well-defined center of symmetry. This difference in symmetry between the two layers in turn creates a geometrical ambiguity in resist layer structure 112. For example, the overlay defined with respect to the top 118a of the resist layer structure 112 is different from the overlay defined with respect to the bottom 118b of the resist layer structure 112. This ambiguity associated with the asymmetric resist layer structure 112 in turn creates an overlay 116 that is not well defined. It is further noted that if the given metrology measurement tools are sensitive to overlay mark asymmetry the existence of asymmetry, such as that depicted in FIG. 1B, may lead to enhanced asymmetry in the measured signal, resulting in overlay measurement inaccuracy.

Figure 2:
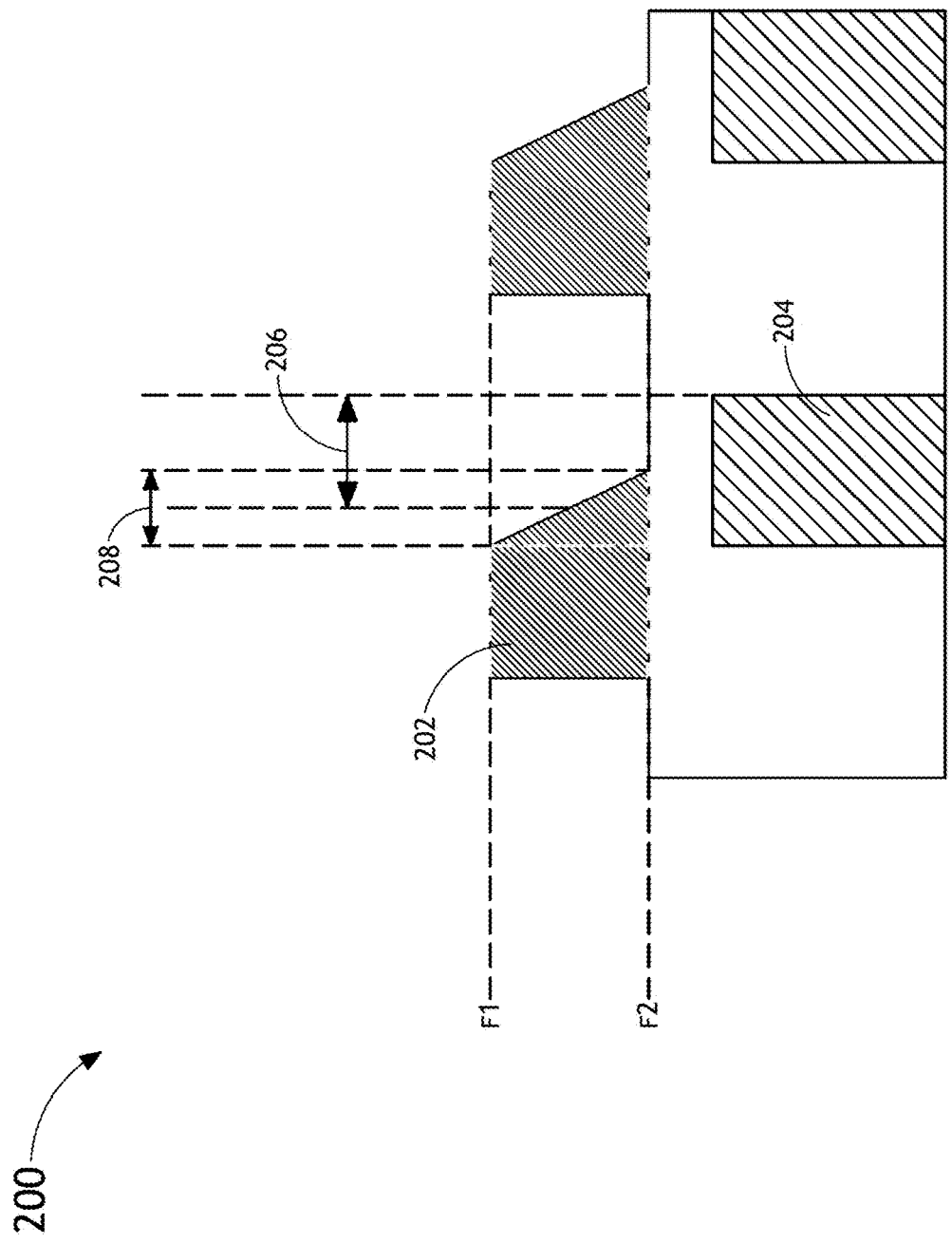
FIG. 2 illustrates a cross-sectional view of a metrology target having an asymmetric target structure and the impact of illumination having more than one focal point, in accordance with one embodiment of the present invention.

It is known in the art that metrology tool setup may influence the outcome of a metrology measurement. As such, the measured overlay is not defined merely by a shift between the structures belonging to the layers under discussion. By way of a first example, when a different measurement focal plane is selected, the measurement results can vary systematically. By way of a second example, when a different illumination spectrum is utilized in the measurement, the result of the measurement can also vary systematically (i.e. non-randomly with illumination selection). These effects can be attributed to at least two sources. The first is related to the metrology target itself. For example, as shown in FIG. 2, if the target profile is asymmetric then a shift in the focal plane of the metrology system will result in an apparent lateral shift in the metrology result. In this manner, the illumination associated with a first focal length F1 may strongly interact with the top surface of the top layer target structure 202, while illumination having a focal length of F2 may strongly interact at the bottom surface of the top layer target structure 202. As a result, the overlay measurement 206 between a top structure 202 and the bottom structure 204 may include a corresponding overlay ambiguity 208.

Figure 3:
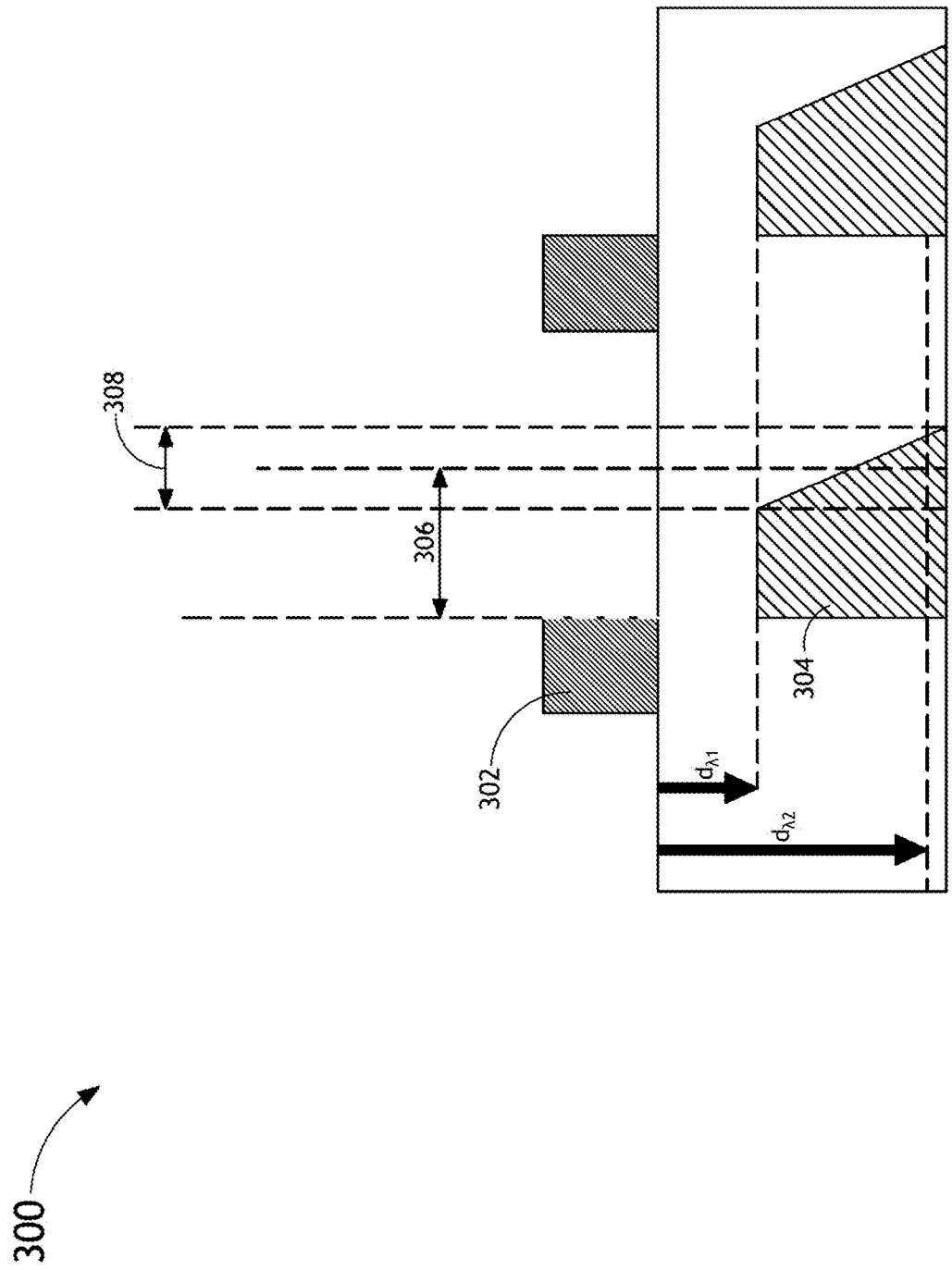
FIG. 3 illustrates a cross-sectional view of a metrology target having an asymmetric target structure and the impact of illumination having more than one wavelength, in accordance with one embodiment of the present invention.

Alternately, as shown in FIG. 3, if there is a layer with spectrally dependent absorption characteristics, such as, but not limited to, polySi or carbon hardmask combined with an asymmetric target structure in the buried layer, then the measured overlay may vary with the illumination spectrum. In this manner, depending on the specific material in question and the incident illumination, the illumination associated with a first wavelength may only penetrate the material layer to a first depth ($d_{\lambda,1}$), wherein illumination of a second wavelength may penetrate to a further depth ($d_{\lambda,2}$). Due to this difference, the different illumination will interact with the target structure 304 of the bottom layer in different ways. As such, the overlay measurement 306 between a top structure 302 and the bottom structure 304 may include a corresponding overlay ambiguity 308. As discussed in greater detail further herein, it is one aspect of the present invention to provide a system and method suitable for identifying the set of parameters of a measurement recipe which optimize or at least improve the overlay measurement result.

It is noted that these ambiguities are present even if the metrology system is nominally perfect and induces no tool induced shift or any other form of systematic bias to the metrology result. An additional target related characteristic, of particular importance in scatterometry metrology, relates to the fact that metrology is often performed on more than a single cell within the metrology target. The metrology ambiguity associated with this cell-to-cell variability is also estimated by the methods described herein. Sources of illumination asymmetry may include, but are not limited i) side wall angle asymmetries of both previous layer and current layer; ii) height differences of current and previous layer; iii) height differences of intermediate layers between the measured layer and layer below them; iv) variations due to local defects.

The following description is a theoretical explanation for asymmetry-induced overlay accuracy. In the case of imaging-based overlay metrology, the portion of a collected image corresponding to the target layer having asymmetry may be written as:

$$\text{Image} \propto \left| a_0 e^{i\phi_0} + a_{+1} e^{i\phi_{+1}} \cdot e^{\frac{2\pi i}{P}(x-OVL)} + a_{-1} e^{i\phi_{-1}} \cdot e^{-\frac{2\pi i}{P}(x-OVL)} + \ldots \right|^2 \quad \text{(Eq. 1)}$$

where $a_0, a_{+1}, a_{+1}, \ldots$ correspond to the amplitudes of the different diffracted orders of the electric field of the signal used to form the image, and $\phi_0, \phi_{+1}, \phi_{+1}, \ldots$ correspond to the phases of the signal used to form the image. The assumption of signal symmetry may be expressed as:

$$a_{+n} = a_{-n} \text{ and } \phi_{+n} = \phi_{-n} \text{ for every } n \quad \text{(Eq. 2)}$$

Since the phases of the electric field determine the geometrical center of the signal, the breakdown of phase symmetry corresponds to a geometrical overlay ambiguity. Further, the breakdown of symmetry of the amplitudes $a_{+n}$ and $a_{-n}$ leads to overlay inaccuracy, which may significantly exceed the geometrical ambiguity. For example, in cases where most of the measurement error comes from the first diffracted order, the overlay inaccuracy, $\Delta$, is expressed as:

$$\Delta \approx \frac{P}{2\pi} \cdot \left( \frac{\phi_{+1} - \phi_{-1}}{2} + \alpha \cdot \frac{a_{+1} - a_{-1}}{a_{+1} + a_{-1}} \right) \quad \text{(Eq. 3)}$$

where $\alpha$ is a function of one or more material parameters associated with the metrology configuration (e.g., wavelength, focus, angle of illumination, and the like). The first term in Eq. 3 represents the geometrical ambiguity. It is anticipated that with suitable overlay target design a geometrical ambiguity smaller than 1 nm is achievable. In addition, the second term of Eq. 3 represents the additional inaccuracy associated with the sensitivity of the given metrology technology to overlay target asymmetry. For some material parameters, a may take values as large as 10, in which case the second term of Eq. 3 results in large overlay inaccuracy, as large or larger than 5 nm.

For purposes of simplicity it is assumed above that asymmetry of the given overlay target exists in only one layer (e.g., process layer or resist layer) of the overlay target. It is further assumed that the target structure is periodic in nature, with a period of P. It is recognized, however, that similar results may be achieved in cases where asymmetry exist in both target layers and the target is non-periodic.

In the case of diffraction-based overlay (DBO) metrology, the overlay mark consists of gating-over-grating structures, one of which is symmetric and the other asymmetric according to the assumptions described above. It is recognized that overlay may be extracted from a signal calculated as the difference between the $+1^{st}$ diffracted order and the $-1^{st}$ diffracted order. This differential signal may be expressed as:

$$\text{Signal} \propto \left| a_{0,+1} e^{i\phi_{0,+1}} + a_{+1,0} e^{i\phi_{+1,0}} \cdot e^{\frac{2\pi i}{P}(OVL+offset)} + \ldots \right|^2 - \left| a_{0,-1} e^{i\phi_{0,-1}} + a_{-1,0} e^{i\phi_{-1,0}} \cdot e^{-\frac{2\pi i}{P}(OVL+offset)} + \ldots \right|^2 \quad \text{(Eq. 4)}$$

where $\alpha$, represents the amplitude of the $(n+m)^{th}$ diffracted order from the grating-over-grating mark, which consists of the $n^{th}$ diffracted order from the asymmetric grating and the $m^{th}$ diffracted order from the symmetric grating. As with imaging-based overlay metrology, in cases where most of the signal error results from the first diffracted order from the asymmetric grating, the inaccuracy, A, takes the form:

$$\Delta \approx \frac{P}{2\pi} \cdot \left( \frac{\phi_{+1,0} - \phi_{-1,0}}{2} + \alpha \cdot \frac{a_{+1,0} - a_{-1,0}}{a_{+1,0} + a_{-1,0}} \right) \quad \text{(Eq. 5)}$$

where $\alpha$ again depends one or more material parameters associated with the metrology configuration (e.g., wavelength, focus, angle of illumination, and the like). Here, too, the first term corresponds to the geometrical ambiguity which is expected to be smaller than 1 nm for a well designed overlay mark. The second term is responsible for the inaccuracy beyond the ambiguity. In the case of DBO metrology, the second term may reach magnitudes of large as or larger than 10 nm. It is noted that in a general sense DBO metrology may be more sensitive to overlay mark asymmetry than imaging overlay metrology. It is recognized herein that this can be attributed to the fact that in the case of imaging-based overlay metrology the measured signal is averaged over a broader range of wavelengths and angles. Since the different wavelengths and angles give rise to different inaccuracy, the averaging acts to statistically reduces the observed inaccuracy.

Figure 4A:
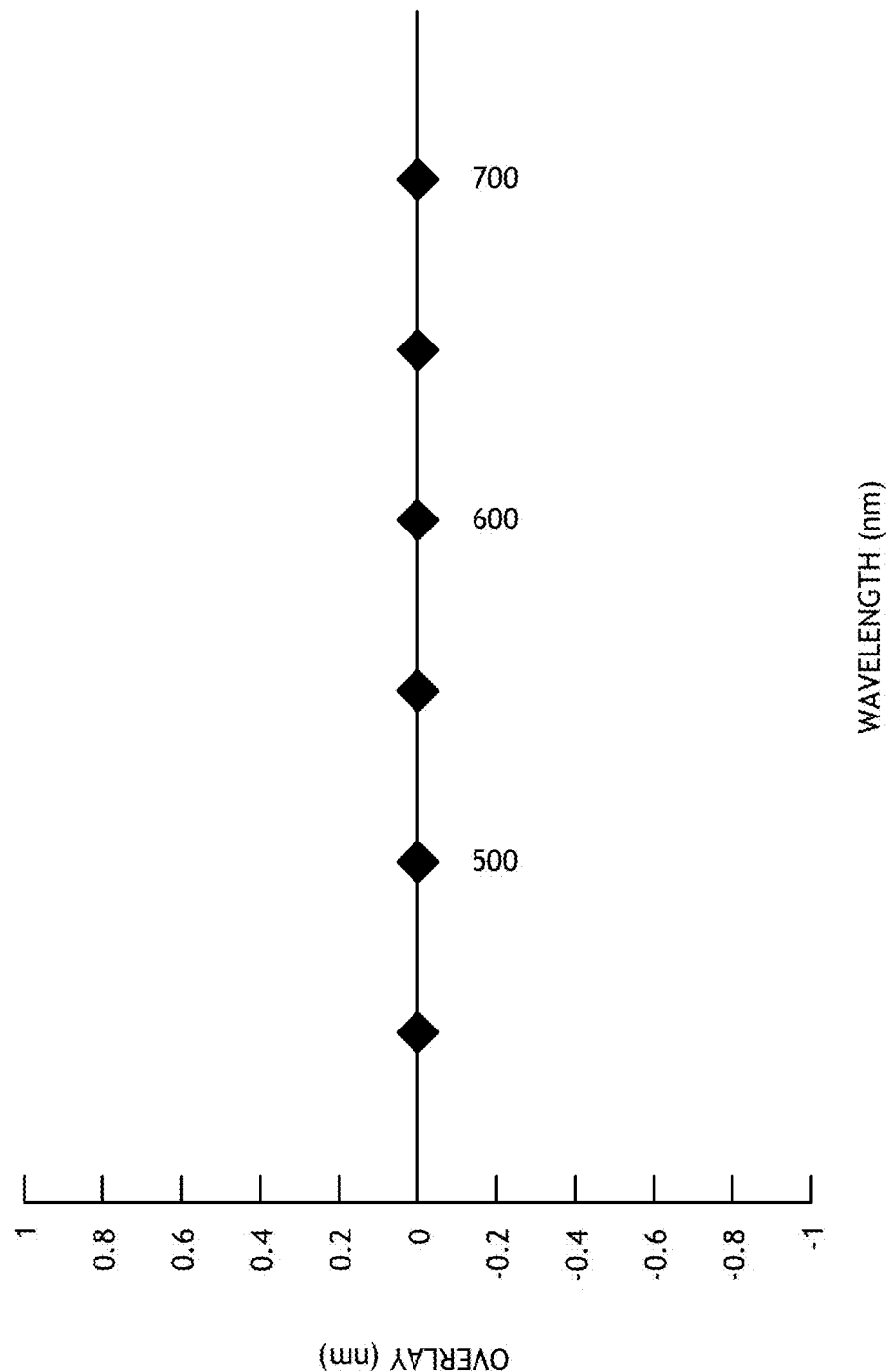
FIG. 4A illustrates modeled data obtained from symmetric target structure at multiple wavelengths, in accordance with one embodiment of the present invention.
Figure 4B:
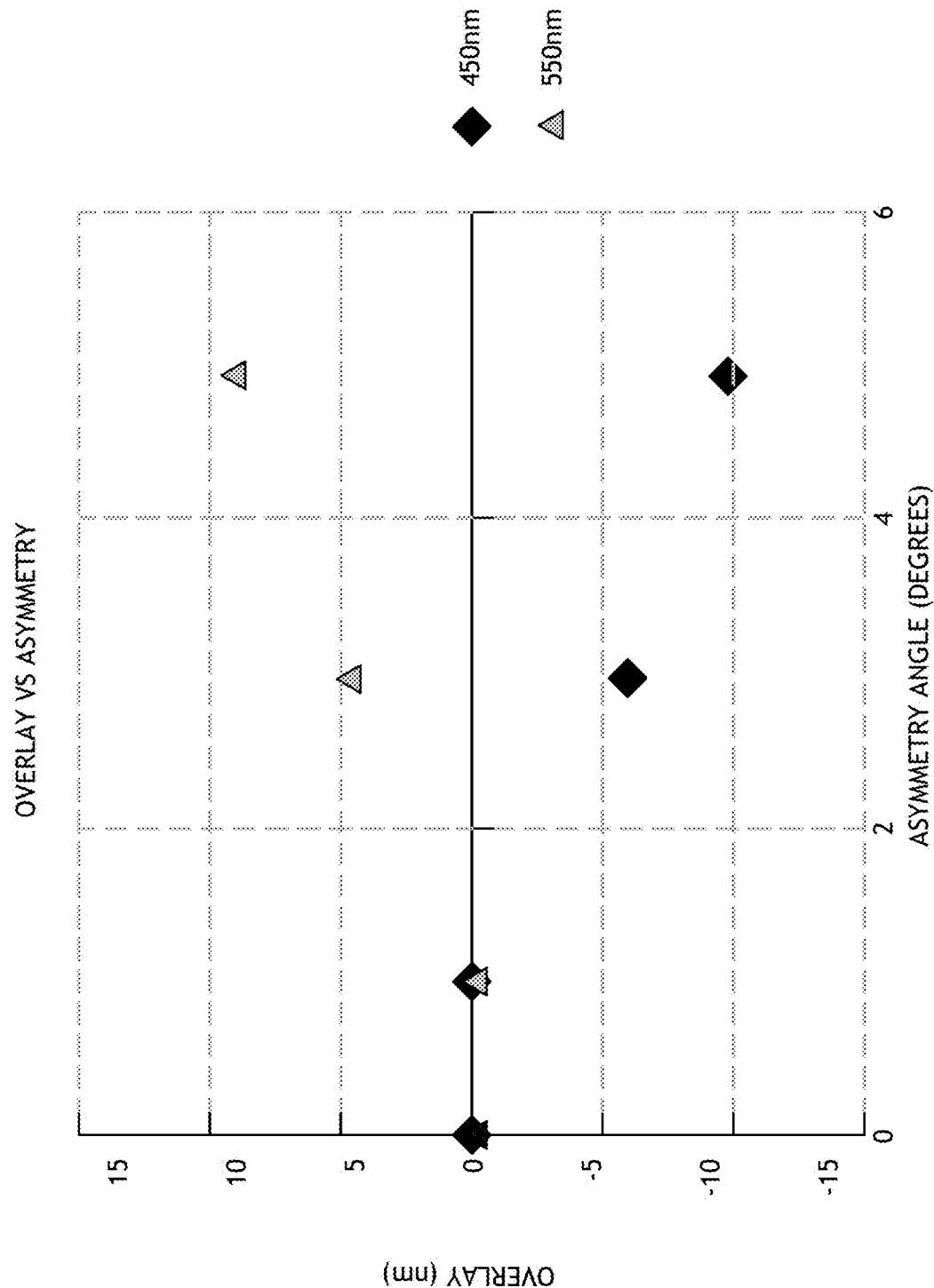
FIG. 4B illustrates modeled data obtained from asymmetric target structure at multiple wavelengths, in accordance with one embodiment of the present invention.

FIGS. 4A and 4B illustrate the impact of illumination wavelength and asymmetry angle on the measured overlay of a target. As shown in FIG. 4A, in the case of symmetric targets illumination wavelengths have no impact on the deviation of measured wavelength. In contrast, as shown in FIG. 4B, illumination wavelength has a strong impact on the measured overlay in the case of a home water.

Figure 5:
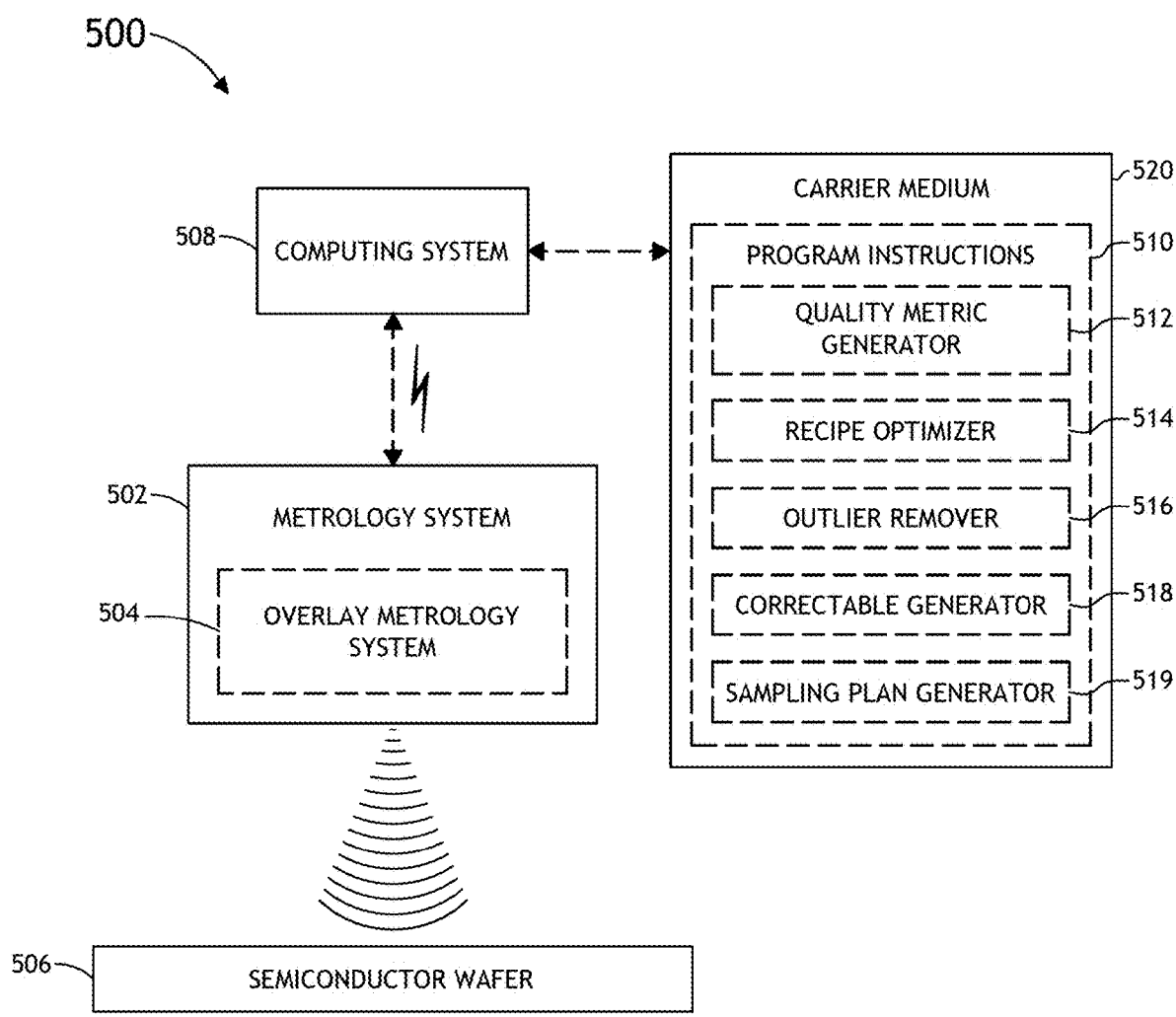
FIG. 5 illustrates a block diagram view of a system suitable for providing a quality metric suitable for improving process control in a semiconductor wafer fabrication, in accordance with one embodiment of the present invention.

FIG. 5 illustrates a system 500 for providing a quality metric suitable for improving process control in a semiconductor wafer fabrication process. In one embodiment, the system 500 may include a metrology system 502, such as an overlay metrology system 504 configured to perform overlay metrology at identified locations of the semiconductor wafer 506. In a further embodiment, the metrology system 502 may be configured to accept instructions from another subsystem of the system 500 in order to carry out a designated metrology plan. For instance, the metrology system 502 may accept instructions from one or more computing systems 508 of the system 500. Upon receiving the instructions from the computing system 508, the metrology system 502 may perform overlay metrology at the locations of the semiconductor wafer 506 identified in the provided instructions. As will be later discussed, the instructions provided by the computer system 508 may include a quality metric generator algorithm 512 configured to generate one or more quality metrics associated with each overlay measurement of the system 502.

Figure 6:
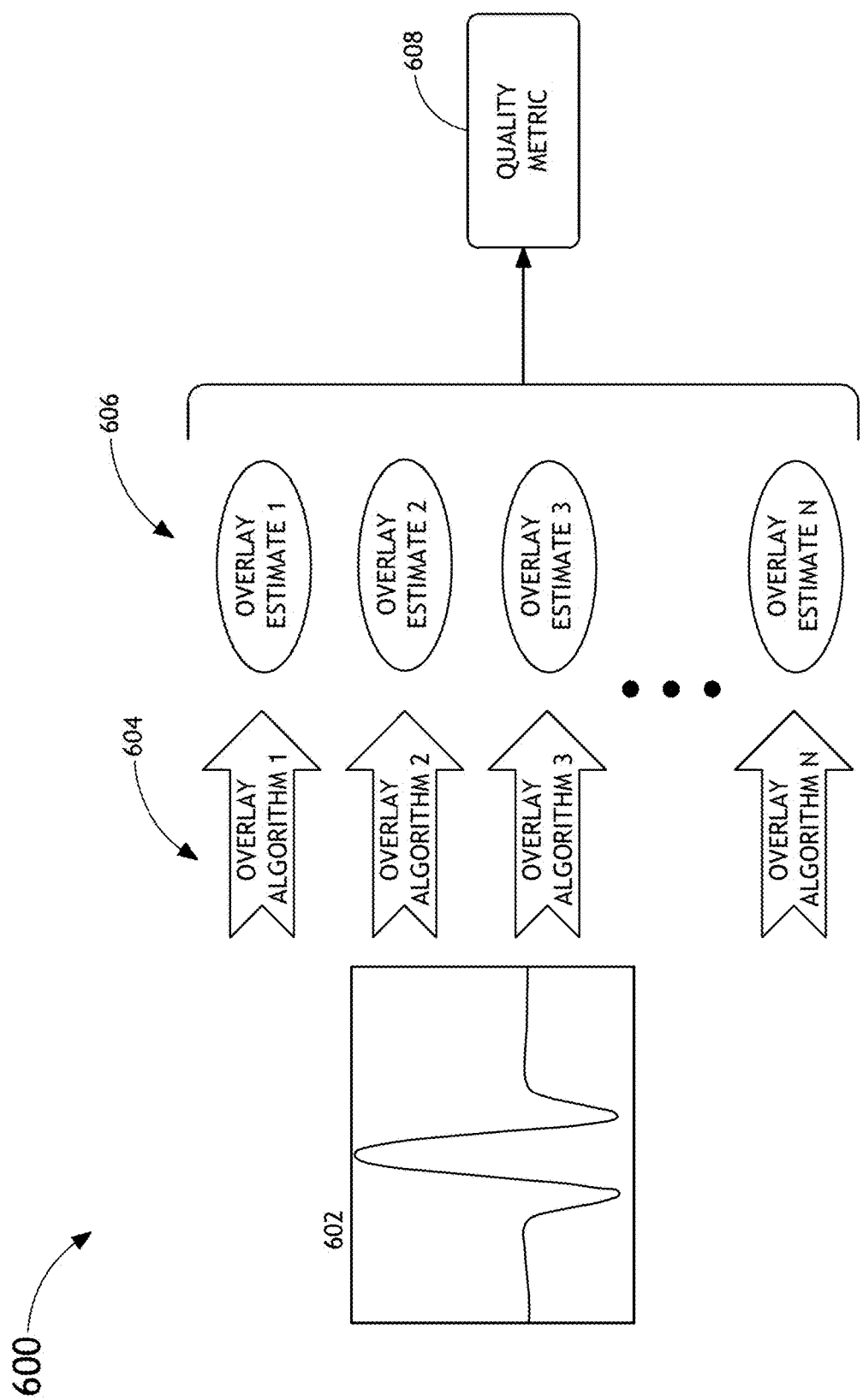
FIG. 6 illustrates a conceptual view of a method suitable for providing a quality metric suitable for improving process control in a semiconductor wafer fabrication, in accordance with one embodiment of the present invention.

FIG. 6 illustrates a conceptual illustration of the quality metric generation process, in accordance with one embodiment of the present invention. The quality metric generation process 600 may include applying N number of overlay algorithms 604 (e.g., overlay algorithm 1, overlay algorithm 2, and overlay algorithm 3) to one or more acquired (e.g., acquired using an associated metrology tool) metrology signals 602 in order to calculate N overlay estimates (e.g., overlay estimate 1, overlay estimate 2, and overlay estimate 3). Then, based on the span, or distribution, of these calculated overlay estimates a quality metric 608 for each sampled metrology target of a wafer may be generated. In this sense, the quality metric 608 obtained for each overlay metrology target is a measure or estimate of the variation of the overlay result as a function of the set of applied overlay algorithms.

It is noted herein that the quality metric of the present invention provides a quantitative evaluation of the accuracy of an associated overlay result for a given metrology target. In this sense, each overlay value of a metrology target of a wafer is accompanied with a corresponding quality metric related to the accuracy of the specific overlay measurement of the target in question. It is further anticipated that the quality metric of the present invention is applicable to all imaging metrology targets, such as, but not limited to, BiB, AIM, AIMid, Blossom, and multilayer AIMid.

Referring again to FIG. 5, in a further aspect, it is noted that the results of the quality metric generator algorithm 512 may be used for a variety of purposes. In one embodiment, the system 500 may include an overlay measurement recipe optimizer 514. The overlay measurement recipe optimizer 514 is an algorithm configured to utilize the set of generated quality metrics of the present invention as an input to calculate an optimal or improved overlay measurement recipe. In this regard, the overlay measurement recipe optimizer 514 may utilize multiple sets of quality metrics acquired from the set of measured metrology targets to determine the metrology measurement recipe (e.g., wavelength of illumination, filtering configuration, polarization configuration, illumination angle, and the like) that optimizes the overlay accuracy. It is further recognized that the results of the recipe optimizer algorithm 514 may be implemented on subsequent overlay measurements on the same wafer or other wafers of the lot of wafers. In this sense, the improved or optimized metrology recipe (calculated using recipe optimizer 514) may be fed back to the metrology system 502. Recipe optimization using the generated quality metrics of the present invention will be discussed in greater detail further herein.

In another embodiment, the system 500 may include a metrology target outlier remover 516. The metrology target outlier 516 remover is an algorithm configured to identify and remove outlier metrology targets utilizing the set of generated quality metrics of the present invention as an input. In this regard, the outlier remover 516 may identify metrology targets having large quality metric values, and hence large overlay inaccuracies, and disregard them for the purposes of subsequent process tool correctable calculation. It should be recognized that the removal of outlier targets in the correctable calculation is advantageous as it puts larger weight in the correctable calculation on those targets having a larger degree of accuracy, thereby improving the correctable calculation. Metrology target outlier removal using the generated quality metrics of the present invention will be discussed in greater detail further herein.

In another embodiment, the system 500 may include a sampling plan generator 519. The sampling plan generator 519 is an algorithm configured to generate one or more overlay metrology sampling plans utilizing the generated quality metrics of the present invention as an input. In this regard, the sampling plan generator 519 create sampling plans, such as sub-sampling plans, which allow for greater weight to be given to identified high quality targets and less weight to low quality metrology targets. In another aspect, the sampling plan generator 519 may create a sampling plan that mitigates the presence of low quality targets by increase the rate of sampling of a group of identified low quality targets. Metrology sampling plan generation using the generated quality metrics of the present invention will be discussed in greater detail further herein.

In another embodiment, the system 500 may include a correctables generator 518. The correctables generator 518 is an algorithm configured to generate one or more sets of process tool correctables using the generated quality metrics. It is noted that the correctables calculated by the computer system 508 may then be fedback to a process tool, such as a scanner tool or lithography tool, of the system 500. It is further noted that the correctables generator 518 may utilize outputs of the other analysis routines of the present invention in order to calculate a set of process tool correctables. For example, the correctables generator 518 of the present invention may utilize the output of the outlier removal algorithm 516 prior to calculating the set of process tool correctables. Process tool calculation is discussed in greater detail further herein.

In one embodiment, the one or more computer systems 508 may be configured to receive a set of measurements performed by the metrology system 502 (e.g., overly metrology system 504) in a sampling process of one or more wafers of a lot of wafers. The one or more computer systems 508 may further be configured to calculate or identify a set of quality metrics, an optimized measurement recipe, a set of high value targets (i.e., identify outlier targets to remove from correctables calculation), or a set of process tool correctables using the received measurements from the sampling process. Moreover, the one or more computer systems 508 may then transmit instructions to an associated process tool (e.g., scanner tool or lithography) tool to adjust the process tool. Alternatively and/or additionally, the computer system 508 may be utilized to monitor one or more process tools of the system. In this sense, in the event the residuals of a residual distribution exceed a predetermined level the computer system 508 may 'fail' the lot of wafers. In turn, the lot of wafers may be 'reworked.'

It should be recognized that the steps described above and throughout the remainder of the present disclosure may be carried out by a single computer system 508 or, alternatively, a multiple computing system 508. Moreover, different subsystems of the system 500, such as the metrology system 502, may include a computing system suitable for carrying out at least a portion of the steps described above. Therefore, the above description should not be interpreted as a limitation on the present invention but merely an illustration.

In another embodiment, the one or more computer systems 508 may transmit instructions to one or more process tools which are indicative of a set of process tool correctables derived from any one of the process described herein. Moreover, the one or more computer systems 508 may be configured to perform any other step(s) of any of the method embodiments described herein.

In another embodiment, the computer system 508 may be communicatively coupled to the metrology system 502 or a process tool in any manner known in the art. For example, the one or more computer systems 508 may be coupled to a computer system of a metrology system 502 (e.g., computer system of an overlay metrology system 504) or to a computer system of a process tool. In another example, the metrology system 502 and a process tool may be controlled by a single computing system. In this manner, the one or more computing system 508 of the system 500 may be coupled to a single metrology-process tool computer system. Moreover, the one or more computing systems 508 of the system 500 may be configured to receive and/or acquire data or information from other systems (e.g., inspection results from an inspection system, metrology results from another metrology system, or process tool correctables calculated from a system, such as KLA-Tencor's KT Analyzer) by a transmission medium that may include wireline and/or wireless portions. In this manner, the transmission medium may serve as a data link between the computing system 508 and other subsystems of the system 500. Moreover, the computing system 508 may send data to external systems via a transmission medium. For instance, the computer system 508 may send calculated quality metrics, process tool correctables, optimized measurement recipes, to a separate metrology system, which exists independently of the described system 500.

The computing system 508 may include, but is not limited to, a personal computer system, mainframe computer system, workstation, image computer, parallel processor, or any other device known in the art. In general, the term "computer system" may be broadly defined to encompass any device having one or more processors, which execute instructions from a memory medium.

Program instructions 510 implementing methods such as those described herein may be transmitted over or stored on carrier medium 520. The carrier medium may be a transmission medium such as a wire, cable, or wireless transmission link. The carrier medium may also include a storage medium such as a read-only memory, a random access memory, a magnetic or optical disk, or a magnetic tape.

The embodiments of the system 500 illustrated in FIG. 5 may be further configured as described herein. In addition, the system 500 may be configured to perform any other step(s) of any of the method embodiment(s) described herein.

Figure 7A:
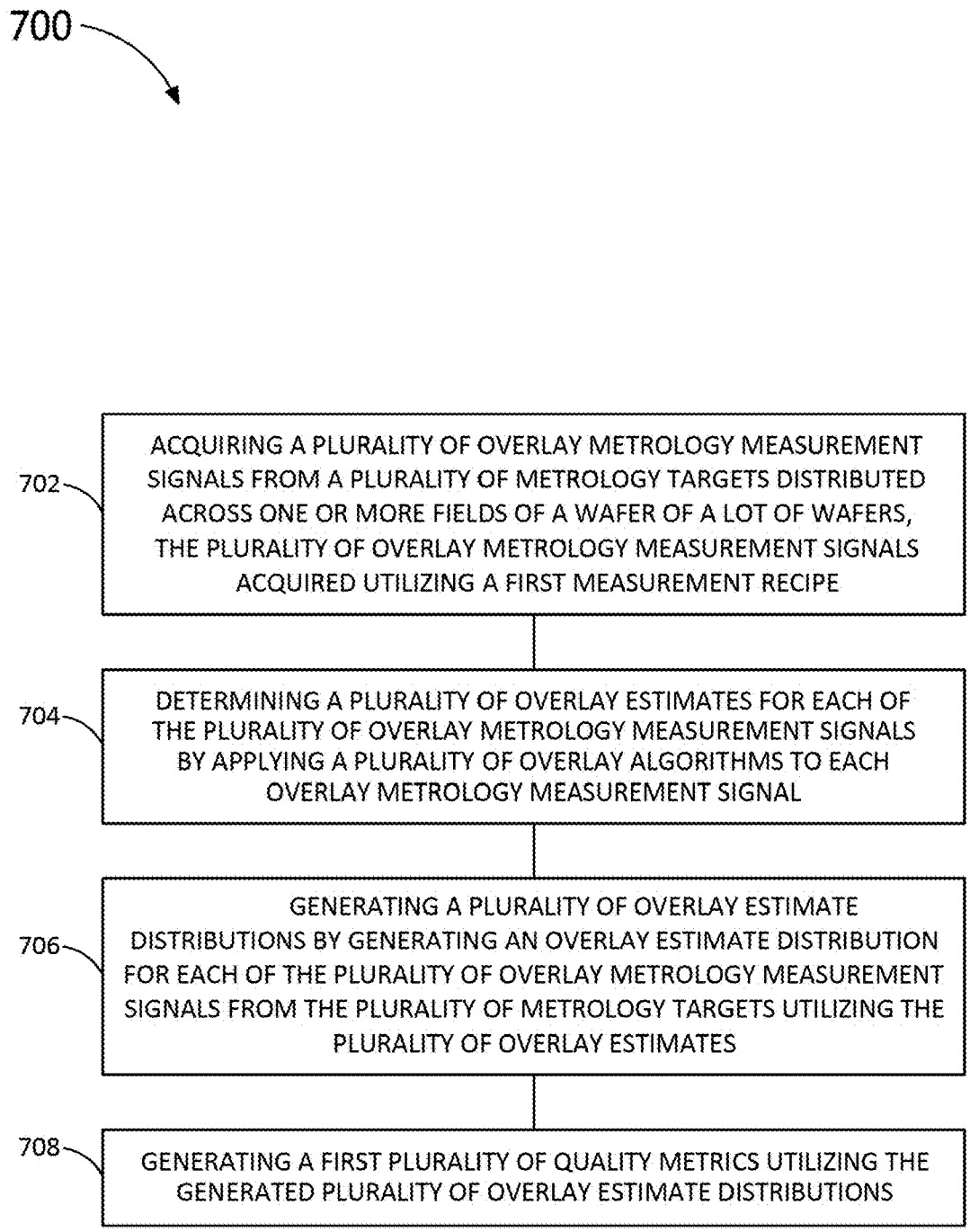
FIG. 7A illustrates a flow diagram of a method suitable for providing a quality metric suitable for improving process control in a semiconductor wafer fabrication, in accordance with one embodiment of the present invention.

FIG. 7A is a flow diagram illustrating steps performed in a method 700 for providing a quality metric suitable for improving process control in a semiconductor wafer fabrication process. In a first step 702, a plurality of overlay metrology measurement signals may be acquired from a plurality of metrology targets distributed across one or more fields of a wafer of a lot of wafers using a first selected measurement recipe. In this sense, a metrology measurement signal may be acquired for each metrology target of the plurality of metrology targets. In one embodiment, a metrology process may measure one or more characteristics (e.g., overlay error) of a plurality of targets distributed across one or more fields of a wafer of a lot of wafers. In a further embodiment, the one or more metrology signals may be acquired utilizing the metrology system 502 (e.g, overlay metrology system 504) of system 500 described previously herein. In this manner, the metrology signals acquired using the metrology system 502 may be transmitted to the computing system 508 via a data link (e.g., wireline or wireless signal).

Figure 7C:
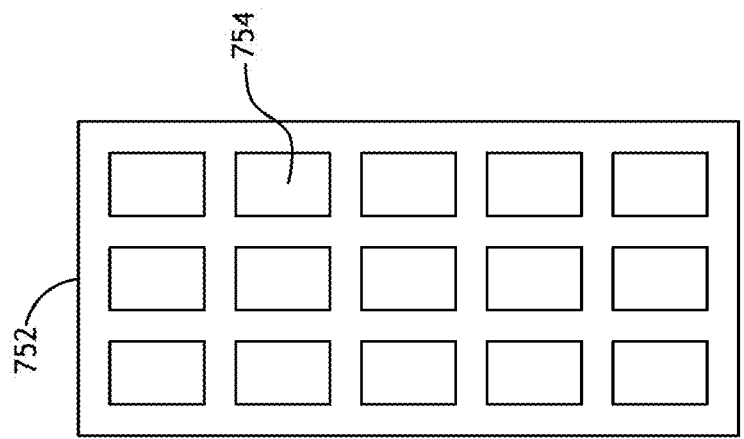
FIG. 7C illustrates a top plan view of a semiconductor wafer having multiple metrology targets with each of the multiple fields of the wafer, in accordance with one embodiment of the present invention.
Figure 7B:
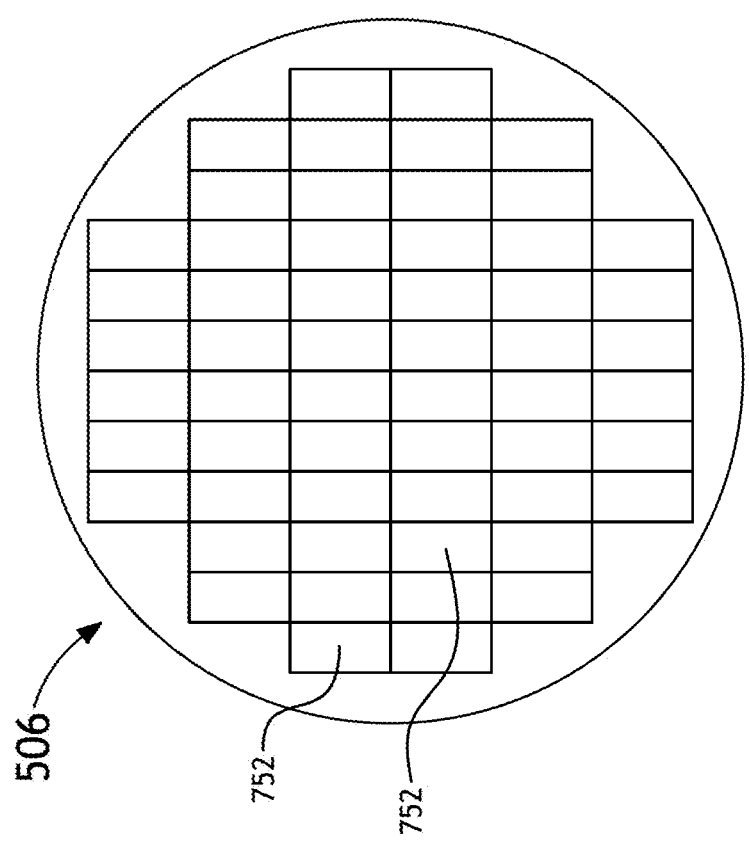
FIG. 7B illustrates a top plan view of a semiconductor wafer having multiple fields, in accordance with one embodiment of the present invention.

In one embodiment, the method 700 includes performing the overlay metrology measurements on one or more wafers in at least one lot of wafers at multiple measurement spots on the one or more wafers. As shown in FIGS. 7B and 7C, the measurement spots may include one or more fields 752 on one or more wafers 506. For example, as shown in FIG. 7B, wafer 506 includes a plurality of fields 752 formed thereon. Although a particular number and arrangement of fields 752 on wafer 506 are shown in FIG. 7B, the number and arrangement of fields on the wafer may vary depending on, for example, the device being formed on the wafers. The measurements may be performed at multiple fields 752 formed on wafer 506 and at multiple fields on other wafers in at least a first lot. The measurements may be performed on device structures formed in the fields and/or on test structures formed in the fields. In addition, the measurements performed in each of the fields may include all of the measurements performed during the metrology process (e.g., one or more different measurements).

In another embodiment, all of the measurement spots measured in a sampling process may include multiple targets within each measured field of the wafers in a given lot. For example, as shown in FIG. 7C, field 752 formed on a wafer 506 may include a plurality of targets 754. Although a particular number and arrangement of targets 754 in field 752 are shown in FIG. 7B, the number and arrangement of targets 754 in the fields 752 may vary depending on, for example, the device being formed on the wafer 506. Targets 754 may include device structures and/or test structures. In this embodiment, therefore, the measurements may be performed on any number of targets 754 formed in each field 752. The measurements may also include all of the measurements that are performed during the metrology process (e.g., one or more different measurements).

In another embodiment, the results of the measurements performed in the sampling step include information concerning variation in the measurement process. The variation in the measurements may be determined in any manner known in the art (e.g., standard deviation, amount of variation, etc.). Since the variation in the measurements will generally indicate variations in the process or process excursions, the number of lots of wafers that are measured in a sampling step may vary depending on the process or the process excursions. The sources of variation that are identified or determined in this step may include any sources of variation including, but not limited to, overlay variation, variation in other characteristics of the wafers, lot-to-lot variation, wafer-to-wafer variation, field-to-field variation, side-to-side variation, statistical sources of variation, and the like, or any combination thereof.

In an additional aspect, the one or more metrology signals may be acquired from one or more metrology targets of a wafer utilizing a first selected measurement recipe. Those skilled in the art will recognize that a metrology recipe may include a wide array of parameter selections. For example, the measurement recipe may include, but is not limited to, illumination wavelength, illumination angle, focus, filter characteristics, polarization, and the like. In further aspects of the present invention, as described in more detail further herein, the metrology recipe implemented b the system 500 may be optimized or at least improved using, in part, the quality metric results generated by the process flow 700.

Metrology processes and systems suitable for implementation in the present invention are described generally in U.S. patent application Ser. No. 12/107,346, filed on Apr. 22, 2008, which is incorporated herein by reference.

In a second step 704, a plurality of overlay estimates for each of the overlay metrology measurement signals of step 302 may be determined by applying a plurality of overlay algorithms to each overlay metrology measurement signal.

In one aspect, a number of different algorithms may be applied to each metrology signal acquired from each of the selected plurality of metrology targets of the wafer 506 in order to determine an overlay estimate for each metrology signal. For example, overlay estimate algorithms 1 through N may each be applied to each signal acquired from each of set of measured metrology targets of a wafer, each algorithm calculating an independent overlay estimate for each target. In a further aspect, each of the implemented algorithms may be configured to provide an exact center of symmetry of a symmetric signal. In the event a signal is symmetric, however, the various algorithms of the plurality of algorithms may provide different estimates for the approximate center of symmetry. In this sense, a metrology target having a non-zero degree of asymmetry will cause the algorithms 1 . . . N to calculate different values for the target overlay for each target measured.

In a third step 706, a set of overlay estimate distributions may be generated by generating an overlay estimate distribution for each of the metrology measurement signals from each of metrology targets utilizing the set of overlay estimates found in step 704. In this regard, for each target of the measured plurality of targets of a wafer the various estimates generated by the algorithms 1-N may be collected into a single overlay estimate distribution. As such, step 706 creates an overlay estimate distribution for each measured metrology target. It is further noted herein that the geometrical overlay ambiguity along with the overlay ambiguity enhancement manifest as a spread function, or span, in the magnitude of the overlay estimate distribution for each analyzed metrology signal. As such, the larger the overlay ambiguity of a given metrology signal the larger the span, or width, of an associated set of overlay estimates (generated with the algorithms 1-N of step 704).

In a fourth step 708, a plurality of quality metrics may be generated. In one aspect, the plurality of quality metric values may be generated utilizing the overlay estimate distributions generated in step 706 of process 700. In this regard, each of the generated quality metrics is associated with one of the overlay estimate distributions of step 706. Each generated quality metric is a function of the width or span of a corresponding overlay estimate distribution and represents a measure or estimate of the overlay ambiguity and inaccuracy associated with a given signal acquired from a given metrology target. In a further aspect, the quality metrics of step 708 are configured to be zero for a perfectly symmetric signal, and proportional to an overlay inaccuracy associated with a given asymmetric signal. It is noted that in order for a symmetric signal to yield a quality metric value of zero each of the overlay algorithms of step 704 must be configured to generate the same overlay estimate for that symmetric signal. The quality metric obtained for each overlay metrology target is a measure or estimate of the asymmetry induced variation of the overlay result as a function of the set of applied overlay algorithms. As such, an analysis of one or more quality metric values associated with a set of overlay measurements acquired from one or more metrology targets provides a 'metric' for analyzing the asymmetry-induced overlay inaccuracy.

Figure 8A:
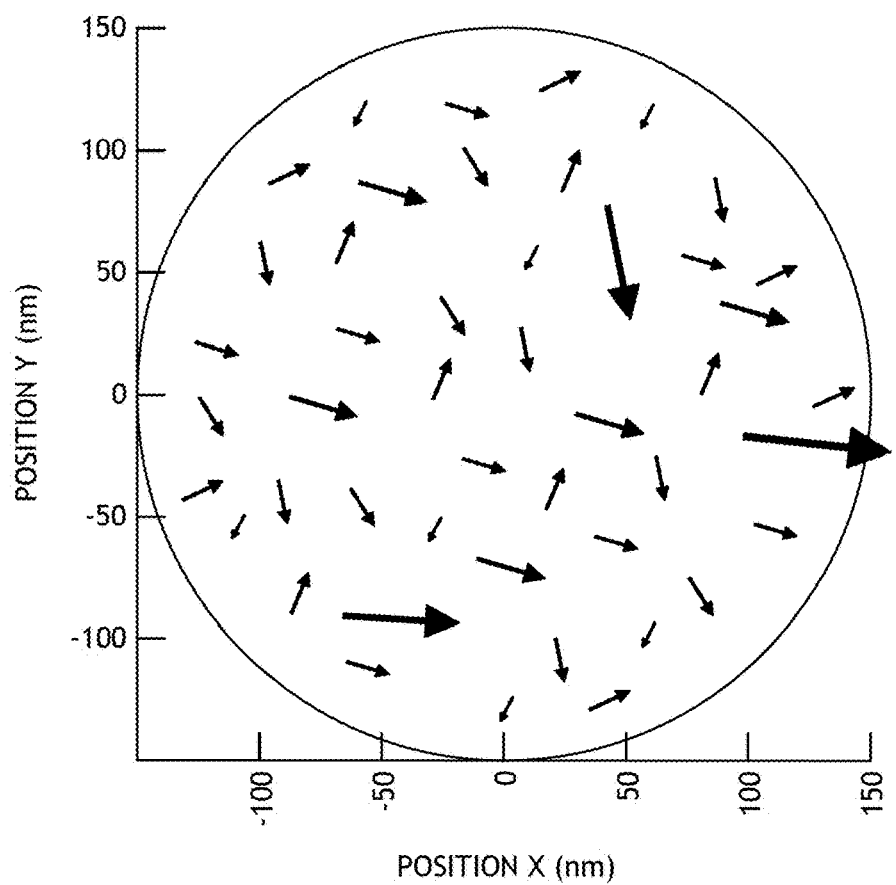
FIG. 8A illustrates a set of modeled overlay inaccuracy data as a function of position on the surface of the wafer, in accordance with one embodiment of the present invention.
Figure 8B:
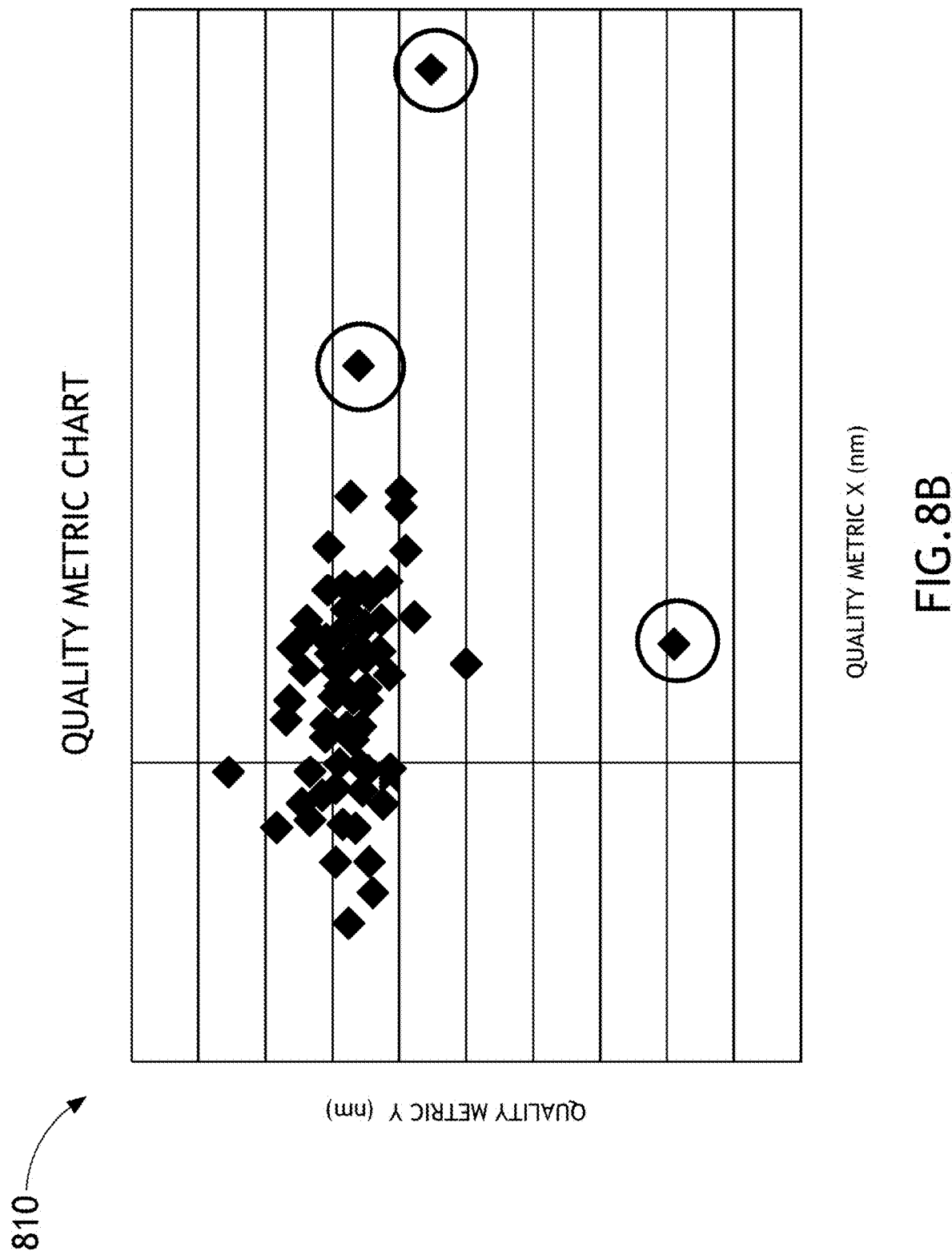
FIG. 8B illustrates a set of modeled quality metric data obtained from a plurality of metrology targets, in accordance with one embodiment of the present invention.

FIG. 8A illustrates an overlay inaccuracy map, in accordance with the present invention. The wafer map 800 of FIG. 8A illustrates the direction and magnitude of overlay inaccuracy of the associated overlay signal. In this sense, the X- and Y-components of the arrows in map 800 correspond to the inaccuracy in X and Y overlay, respectively. FIG. 8B illustrates a generated plurality of quality metrics, in accordance with an embodiment of the present invention. It is noted that each quality metric of FIG. 8B corresponds to a metrology target of the set of sampled metrology targets. It is further noted that the more expansive the quality metric distribution, or quality metric 'cloud,' is in the X-Y directions the more incaccurate the corresponding overlay metrology measurements. As will be discussed in greater detail further herein, methods and systems for reducing the size of the quality metric cloud include outlier removal and recipe optimization.

In a further embodiment of the present invention, the overlay metrology signals acquired from each of a set of measured metrology targets may be corrected for tool induced shift (TIS) prior to implementation of quality metric generation process 700. This is particularly advantageous because the quality metric of the present invention is configured to detect any asymmetry present in an acquired metrology signal, including asymmetry created by optics of the metrology system. Therefore, for a metrology system 502 having optical components that generate significant TIS it is advantageous to first apply a TIS correction to the acquired metrology signal, which allows for the more accurate evaluation of the target-induced overlay inaccuracy.

Figure 9:
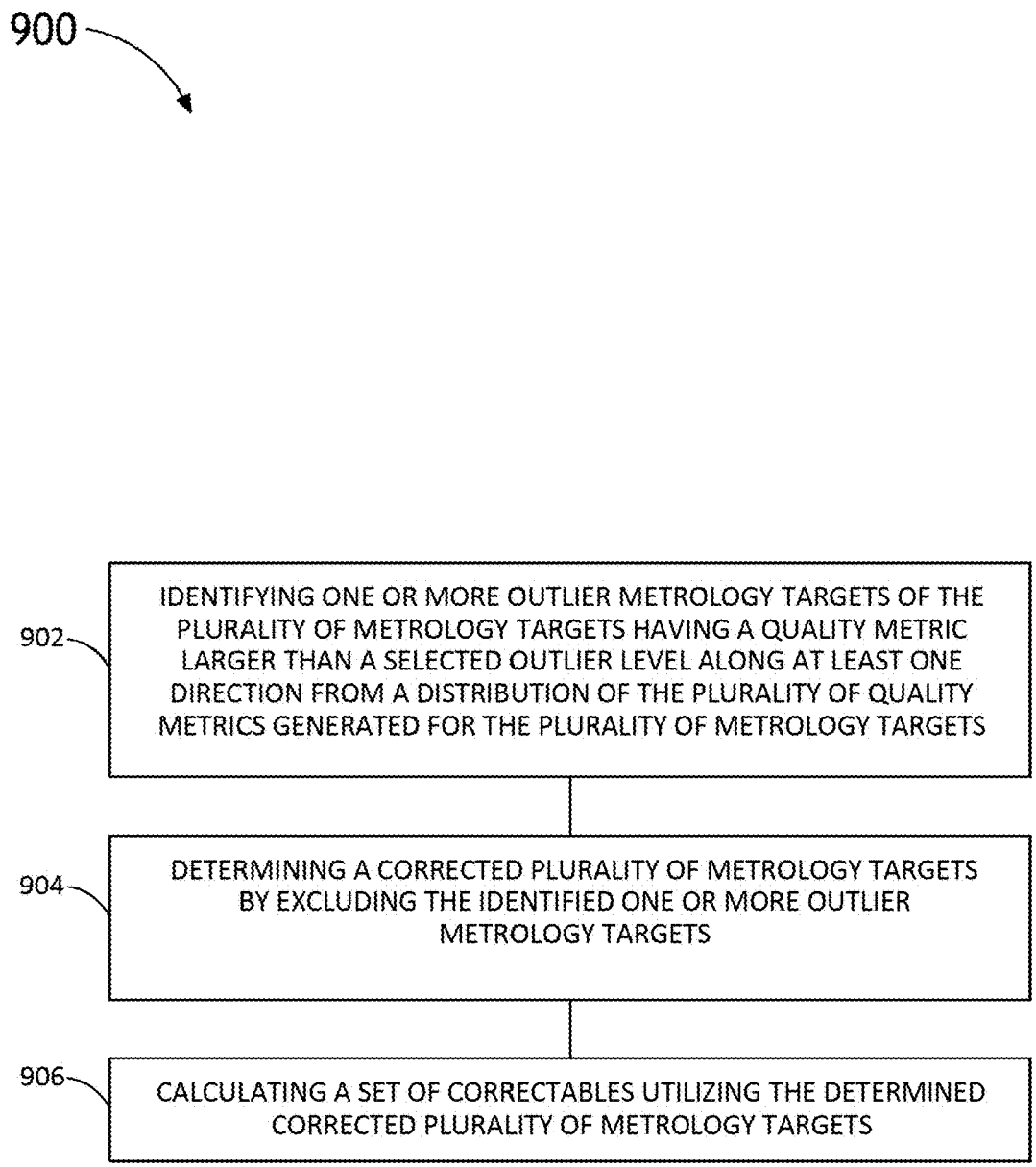
FIG. 9 illustrates a flow diagram of a method for metrology target outlier removal, in accordance with an alternative embodiment of the present invention.

FIG. 9 illustrates flow diagram depicting an additional process flow 900, in accordance with a further embodiment of the present invention. Process flow 900 is directed to utilizing the quality metrics generated in process 700 to identify outlier metrology targets of a sampled set of metrology targets of a wafer. In step 902, one or more outlier metrology targets of the plurality of metrology targets are identified. In this regard, metrology targets displaying a quality metric that deviates significantly from the quality metric values of a distribution of the other metrology targets of the sampled targets may be identified. For instance, as shown in FIG. 8B, three outlying quality metric values are identified (as demarked with circles). Theses outlier quality metric values correspond with metrology targets of the plurality of sampled metrology targets having a high degree of asymmetric (as compared to the non-outlier targets), and, therefore, a high degree of overlay inaccuracy. It is recognized herein that the identification of outliers in the quality metric distribution produced in process 700 may be implemented in any manner known in the art. In this sense, any quantitative analysis package may be used to identify the metrology target outliers. Further, a quality metric of a metrology target may be defined as an outlier by a user or automatically via a statistical analysis package programmed with threshold definition and analysis routines. In this regard, for example, the system 500 may be programmed to automatically identify outlier quality metric values based on: i) the magnitude of the quality metrics of the sampled targets exceeding a selected level; or ii) a selected percentage of the most outlying quality metric values (e.g., defining the largest 10% of the quality metrics as being outlying). In the case of user selection, the quality metric distribution (e.g., quality metric distribution of FIG. 8B) may be displayed on a display device (not shown) of the system 500. The user may then manually select the quality metric values thought to be outliers.

In a second step 904, a corrected set of metrology targets may be generated by excluding the outlier targets identified in step 902. In this regard, the corrected set of metrology targets may be created by removing the identified outlier metrology targets of step 902 from the metrology targets used for correctable calculation.

In a third step 906, a set of process tool correctables is calculated utilizing the corrected set of metrology targets found in step 904. In this sense, only the overlay information for the metrology targets remaining in the corrected set of metrology targets is used to calculate the set of overlay correctables. In a further step, the process tool correctables calculated via computing system 508 may be transmitted to a communicatively coupled process tool (e.g., stepper or scanner). The calculation of process tool (e.g., stepper or scanner) correctables using overlay metrology results is generally described in U.S. Pat. No. 7,876,438, issued on Jan. 25, 2011, and is incorporated herein by reference.

Figure 10:
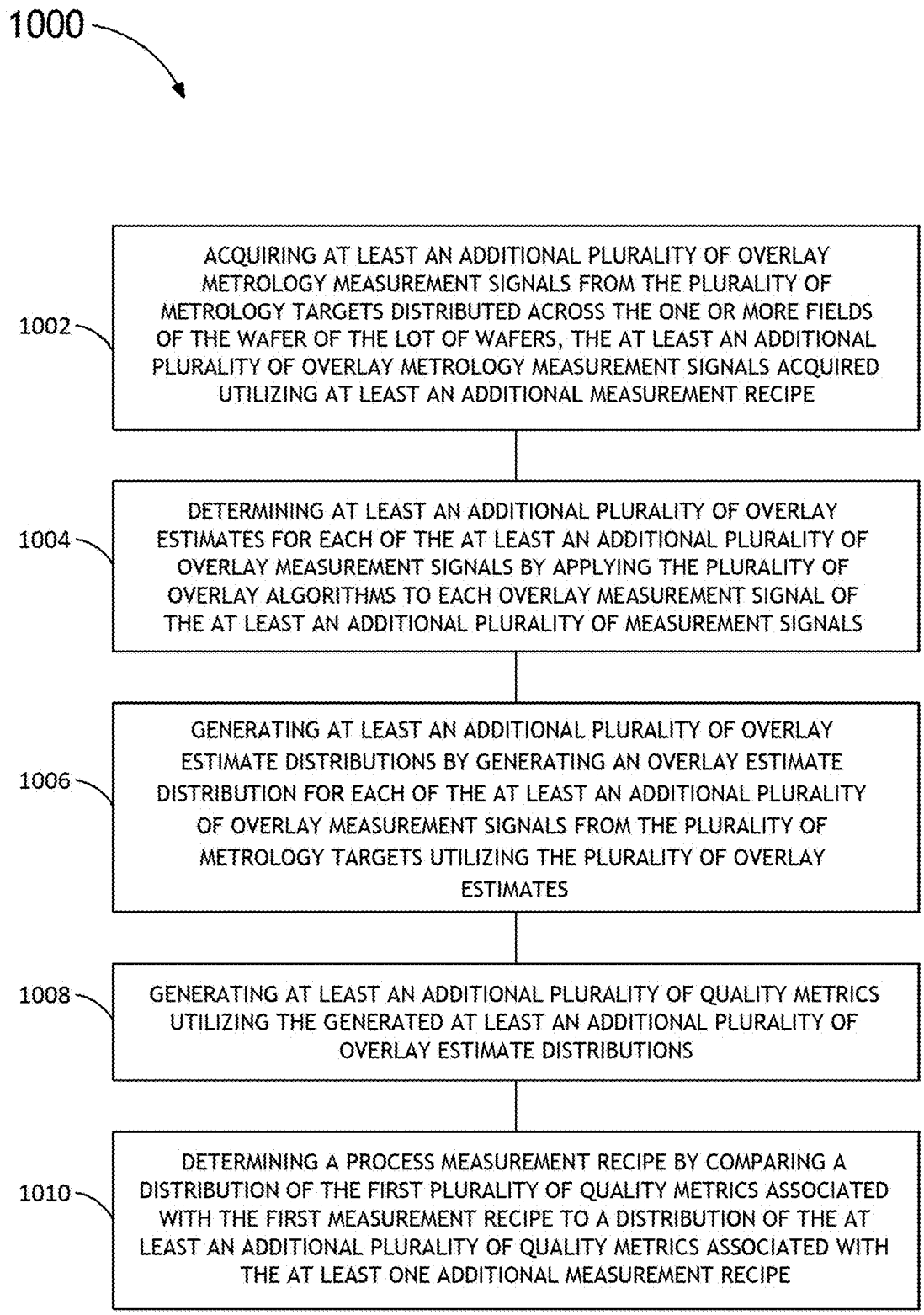
FIG. 10 illustrates a flow diagram of a method for overlay measurement recipe enhancement, in accordance with an alternative embodiment of the present invention.

FIG. 10 illustrates flow diagram depicting an additional process flow 1000, in accordance with a further embodiment of the present invention. Process flow 1000 is directed to utilizing the quality metrics generated in process 700 to identify an improved or an optimized overlay measurement recipe. In a first step 1002, an additional plurality of overlay metrology measurement signals from the plurality of metrology targets may be acquired utilizing at least an additional measurement recipe. In a second step 1004, at least an additional plurality of overlay estimates for each of the at least an additional plurality of overlay measurement signals may be determined by applying the plurality of overlay algorithms to each overlay measurement signal of the at least an additional plurality of measurement signals. In a third step 1006, at least an additional plurality of overlay estimate distributions may be generated by generating an overlay estimate distribution for each of the at least an additional plurality of overlay measurement signals from the plurality of metrology targets utilizing the plurality of overlay estimates. In a fourth step 1008, at least an additional plurality of quality metrics may be generated utilizing the generated at least an additional plurality of overlay estimate distributions. In a fifth step 1010, an improved or optimized process measurement recipe may be determined by comparing a distribution of the first plurality of quality metrics associated with the first measurement recipe to a distribution of the at least an additional plurality of quality metrics associated with the at least one additional measurement recipe.

In this regard, an improved or potentially optimal overlay measurement recipe may be found by performing the quality metric generation process multiple times with varying target measurement recipes for each quality metric generation cycle. For example, in a first cycle the quality metrics for the sampled metrology targets may be found using a set of overlay measurements executed using a first measurement recipe. Then, in a second cycle the quality metrics for the sampled metrology targets may be found using a set of overlay measurements executed using a second measurement recipe, where the second recipe is varied relative to the first recipe (e.g., wavelength is varied, focus position is varied, direction of illumination is varied, and the like). The multiple distributions of quality metrics acquired in each quality metric generation cycle may then be compared to one another in order to identify the measurement recipe producing the smallest quality metric distribution.

Figure 11:
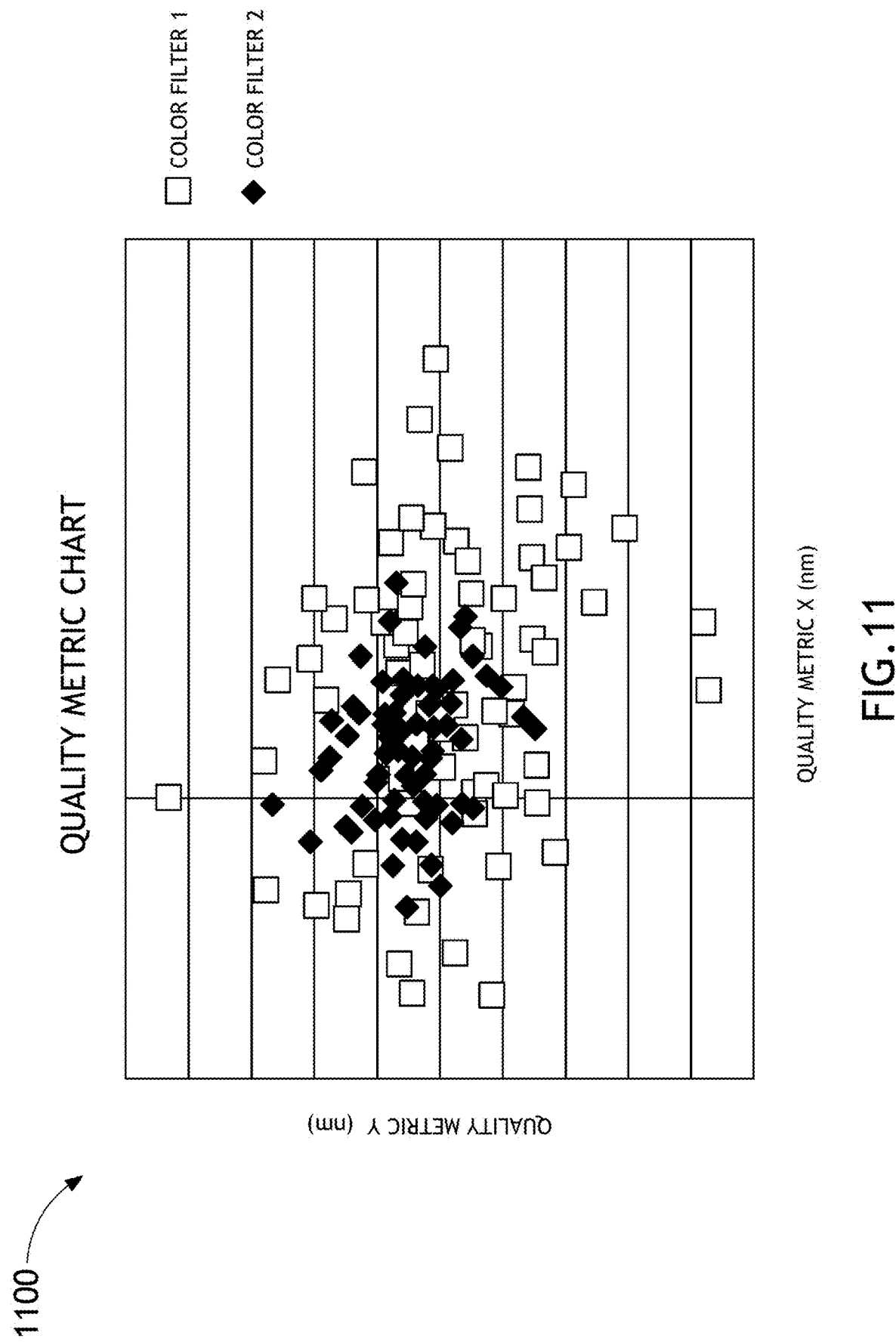
FIG. 11 illustrates a set of modeled quality metric data obtained from a plurality of metrology targets at two different wavelengths, in accordance with one embodiment of the present invention.

FIG. 11 illustrates a quality metric distribution obtained using a first filter and a second filter. As illustrated by the smaller aerial distribution in the X-Y quality metric distribution, color filter 2 provides a smaller inaccuracy in corresponding overlay metrology measurements. Therefore, when choosing between filter 1 and filter 2 in subsequent metrology measurements the use of filter 2 will provide increased overlay accuracy and in turn improved process tool correctables. It is further recognized that this process may be repeated incrementally any number of times (e.g., 1, 2, 3, or up to an including N iterations) for any number of recipe parameters (e.g., wavelength, focus position, direction of illumination, polarization configuration, filter configuration and the like).

Figure 12A:
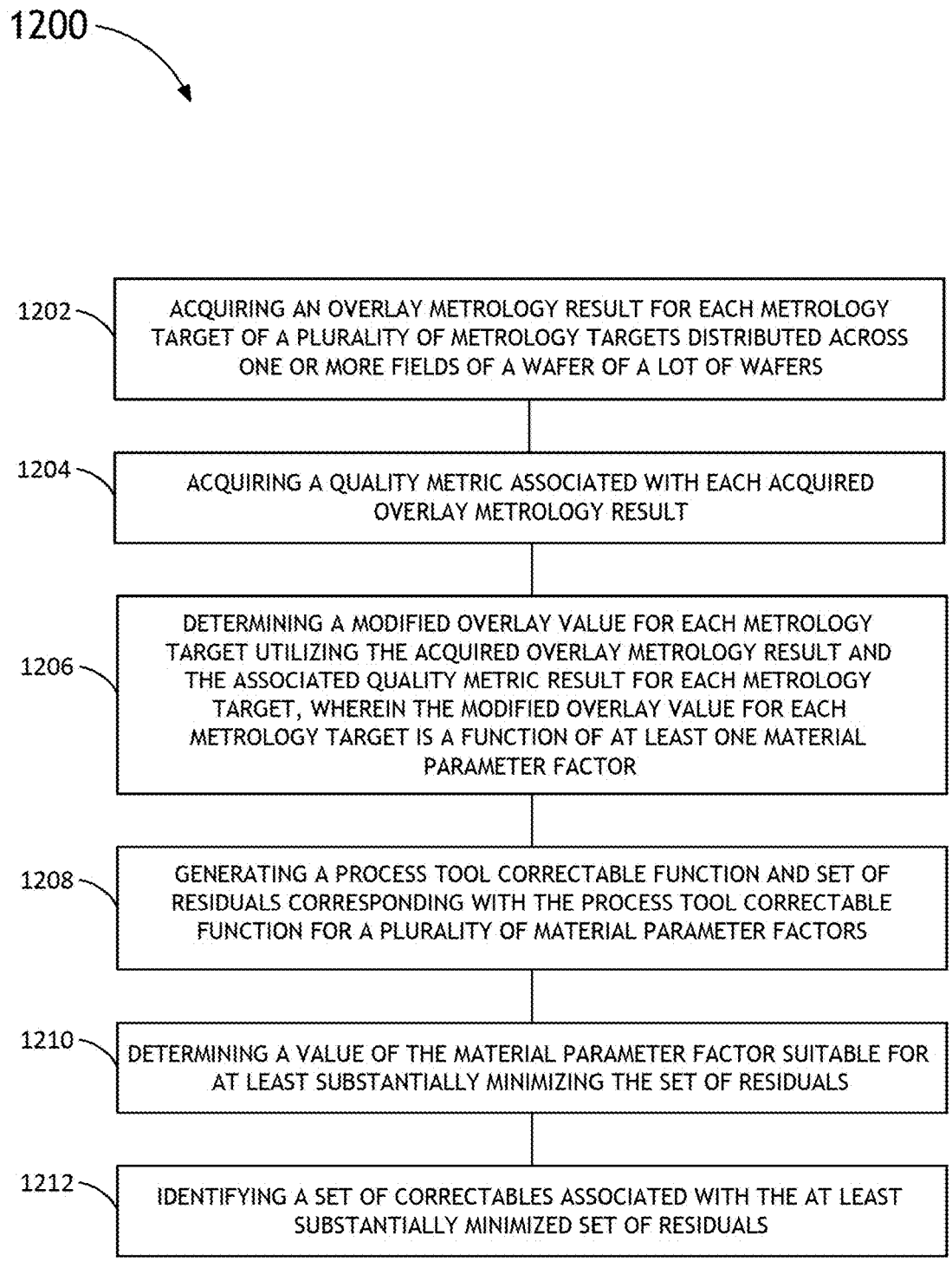
FIG. 12A illustrates a flow diagram of a method for process tool correctables calculation, in accordance with an alternative embodiment of the present invention.
Figure 12B:
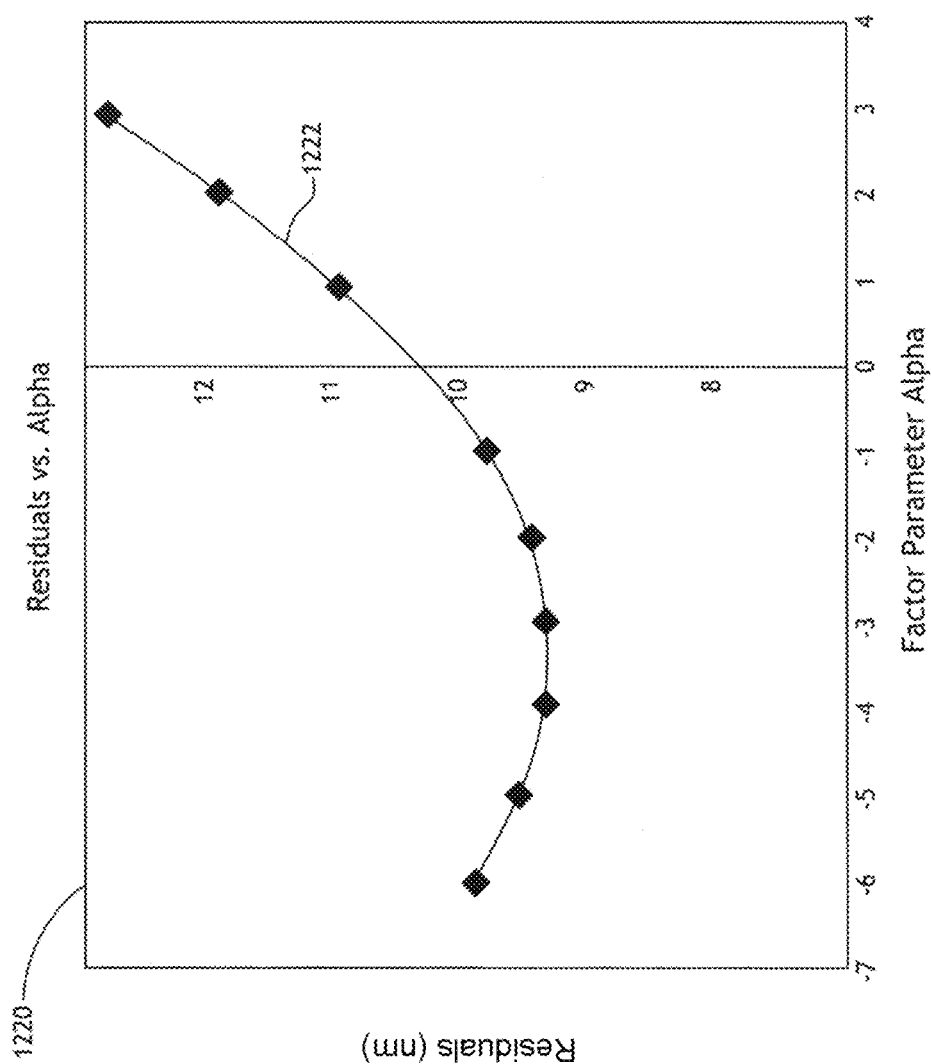
FIG. 12B illustrates a set of data depicting overlay residuals as a function of parameter factor α, in accordance with an alternative embodiment of the present invention.

FIG. 12A is a flow diagram illustrating steps performed in a method 1200 for providing process tool correctables, in accordance with an embodiment of the present invention. Process 1200 is directed to calculating a set of process tool correctables based on the generated quality metrics of process 700. In a first step 1202, an overlay metrology result for each metrology target of a plurality of metrology targets distributed across one or more fields of a wafer of a lot of wafers is acquired. In one embodiment, the overlay metrology result for each metrology target of a plurality of metrology targets may be acquired by performing one or more overlay metrology measurements on the metrology targets utilizing the metrology system 502. In a second step 1204, a quality metric associated with each acquired overlay metrology result may be acquired. In one embodiment, the quality metric may be generated utilizing a process consistent with the various methods and embodiments described throughout the present disclosure. As such, upon acquiring the metrology results for each of the set of measurement metrology targets the system 500 may calculate a quality metric for each of the metrology measurements.

In a third step 1206, a modified overlay value for each metrology target utilizing the acquired overlay metrology result and the associated quality metric result for each metrology target may be determined. In one aspect, the modified overlay value for each metrology target is a function of at least one material parameter factor, $\alpha$, (e.g., dependent on wavelength, focus position, illumination angle and the like) of the metrology scenario.

For example, the modified overlay may be written as:

$$OVL_{accurate} = OVL_{measured} + f(QM) \qquad (Eq. 6)$$

where $OVL_{accurate}$ represents the modified overlay, $OVL_{measured}$ represents the measured overlay, and $f(QM)$ represents the quality function, which depends on the quality metric (QM) associated with each of the metrology targets. In one embodiment, the quality function may be represented by a function that is linear with respect to a material parameter factor, $\alpha$. In this case, the modified overlay can be written as:

$$OVL_{accurate} = OVL_{measured} + \alpha QM \qquad (Eq. 7)$$

where $\alpha$, again, represents the material parameter factor, with QM representing the quality metric calculated or each of the overlay measurements of the present invention. It is recognized herein that the above quality function of Eq. 7 is not limiting and should merely be interpreted as illustrative. It is anticipated that the quality function $f(QM)$ may take on a variety of mathematical forms.

In a fourth step 1208, a correctables function and a set of residuals corresponding with the correctables function for a plurality of material parameter factors may be calculated. In this regard, the parameter $\alpha$ may be varied and a new correctables function and the residuals associated with each correctables function may be calculated for each $\alpha$ value. In a further aspect, any type of correctable function known in the art may implemented in order to fit $OVL_{accurate}$. For instance, the correctables function may include a linear or higher order correctable function. Utilizing one or more of the correctable functions known in the art a series of correctable functions (one for each $\alpha$ value) may be generated. For example, a correctables function and the corresponding residuals may be calculated for $\alpha_1$, $\alpha_2$, $\alpha_3$, and up to and including $\alpha_N$. Functions utilized in the calculation of correctables are described generally in U.S. Pat. No. 7,876,438, issued on Jan. 25, 2011, which is incorporated herein, in its entirety, by reference.

In a fifth step 1210, a value of the material parameter factor suitable for at least substantially minimizing the set of residuals is determined. In this regard, the residuals associated with each of $\alpha_1 \ldots \alpha_N$ may be analyzed to determine the a value that produces the smallest overlay residual level. For example, FIG. 11 illustrates a graph 1220 which plots a set of residuals values from step 1208 calculated for each of a number of $\alpha$ values, along with the corresponding trend-line 1222. As observed in FIG. 11, for the set of given residuals an $\alpha$ value of approximately −3.66 produces the smallest residual value for the given metrology scenario.

In step 1212, the set of correctables associated with the at least substantially minimized set of residuals may be identified. For example, for the illustration of residual minimization provided in step 1210, a set of correctables may be calculated using the residuals minimized with respect to α. It is further anticipated that the α identified in step 1210 may be applied during analysis of subsequent wafers in the lot wafers in order to find correctables related to those subsequent wafers.

In a further embodiment, the set of correctables generated in step 1212 may be transmitted to one or more process tools (e.g., stepper or scanner). In an additional aspect, a TIS correction process may be applied to the acquired plurality of overlay metrology measurement signals prior to analysis in order to reduce TIS-induced asymmetry present in the signals.

Figure 13:
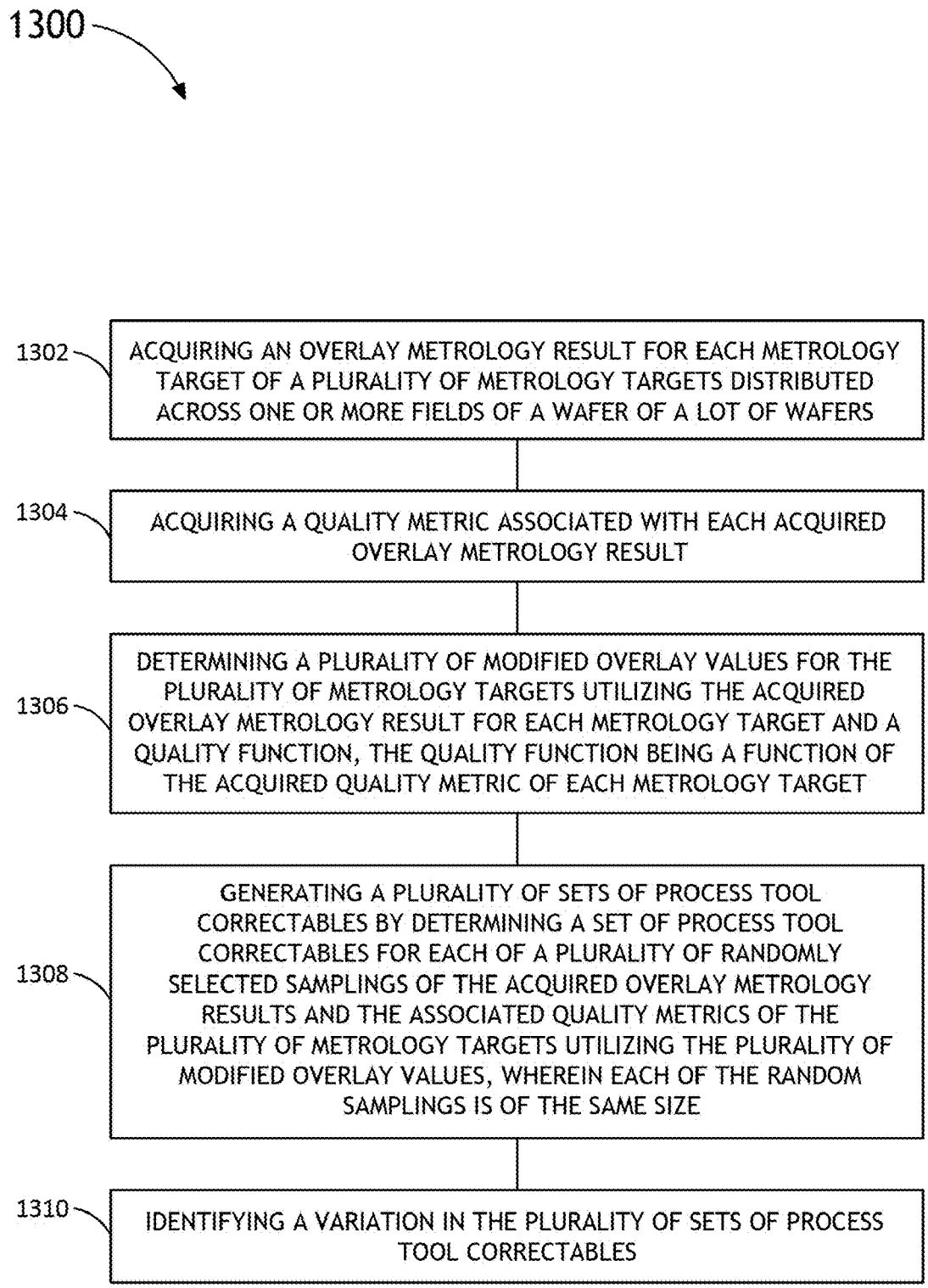
FIG. 13 illustrates a flow diagram of a method for identifying variation in sets of process tool correctables, in accordance with an alternative embodiment of the present invention.

FIG. 13 is a flow diagram illustrating steps performing in a method 1300 for identifying a variation in process tool correctables. In step 1302, an overlay metrology result for each metrology target of a plurality of metrology targets distributed across one or more fields of a wafer of a lot of wafers may be acquired. In one embodiment, the overlay metrology result for each metrology target of a plurality of metrology targets may be acquired by performing one or more overlay metrology measurements on the metrology targets utilizing the metrology system 502.

In step 1304, a quality metric associated with each acquired overlay metrology result is acquired. In one embodiment, the quality metric may be generated utilizing a process consistent with the various methods and embodiments described throughout the present disclosure. As such, upon acquiring the metrology results for each of the set of measurement metrology targets the system 500 may calculate a quality metric for each of the metrology measurements.

In step 1306, a plurality of modified overlay values for the plurality of metrology targets utilizing the acquired overlay metrology result for each metrology target and a quality function is determined. In one aspect, the quality function is a function of the acquired quality metric of each metrology target. In one embodiment, the modified overlay of step 1306 may take the form of that observed in Eq. 6 and/or 7 of process 1200. It is recognized that the quality function $f(QM)$ may take any number of mathematical forms.

In step 1308, a plurality of sets of process tool correctables may be generated by determining a set of process tool correctables for each of a plurality of randomly selected samplings of the acquired overlay metrology results and the associated quality metrics of the plurality of metrology targets utilizing the plurality of modified overlay values, wherein each of the random samplings is of the same size. In this sense, multiple random sub-samplings may be performed wherein a selected number or selected percentage of the available data points is generated. In this regard, each of the multiple sub-samplings may include the same number of sampled data points (e.g., 90%, 80%, 50% and the like). For example, N-number of random samplings of 90% of the data points of the overlay metrology results of step 1302 may be performed, wherein each random sampling represents a different random sampling of the available data points (but with the same number of sampled data points). Then, a set of process tool correctables may be generated using each of the N-number of random samplings. It is further noted that each of the correctables may be calculated using the same quality function $f(QM)$.

In step 1310, a variation in the plurality of sets of process tool correctables may be identified. It is recognized herein that the variation between the sets of process tool correctables calculated in step 1308 is indicative of their quality. It is further recognized herein that the smaller the observed variation in the N-number of correctables the better correctables quality.

It is further noted herein that the quality value that is attached to each overlay value provides an estimate of the non-random error in the given measurement. It may have, however, a random error associated with it, which is higher than that of the overlay measurement. The motivation to use it as described above is when the non-random error is higher than the random error. In circumstances where non-random error is larger than random error, it is worth correcting the overlay value increasing its random error value (it should be remembered that the random error can be averaged to a small values over a lot of measurements) while decreasing the non-random error.

Figure 14:
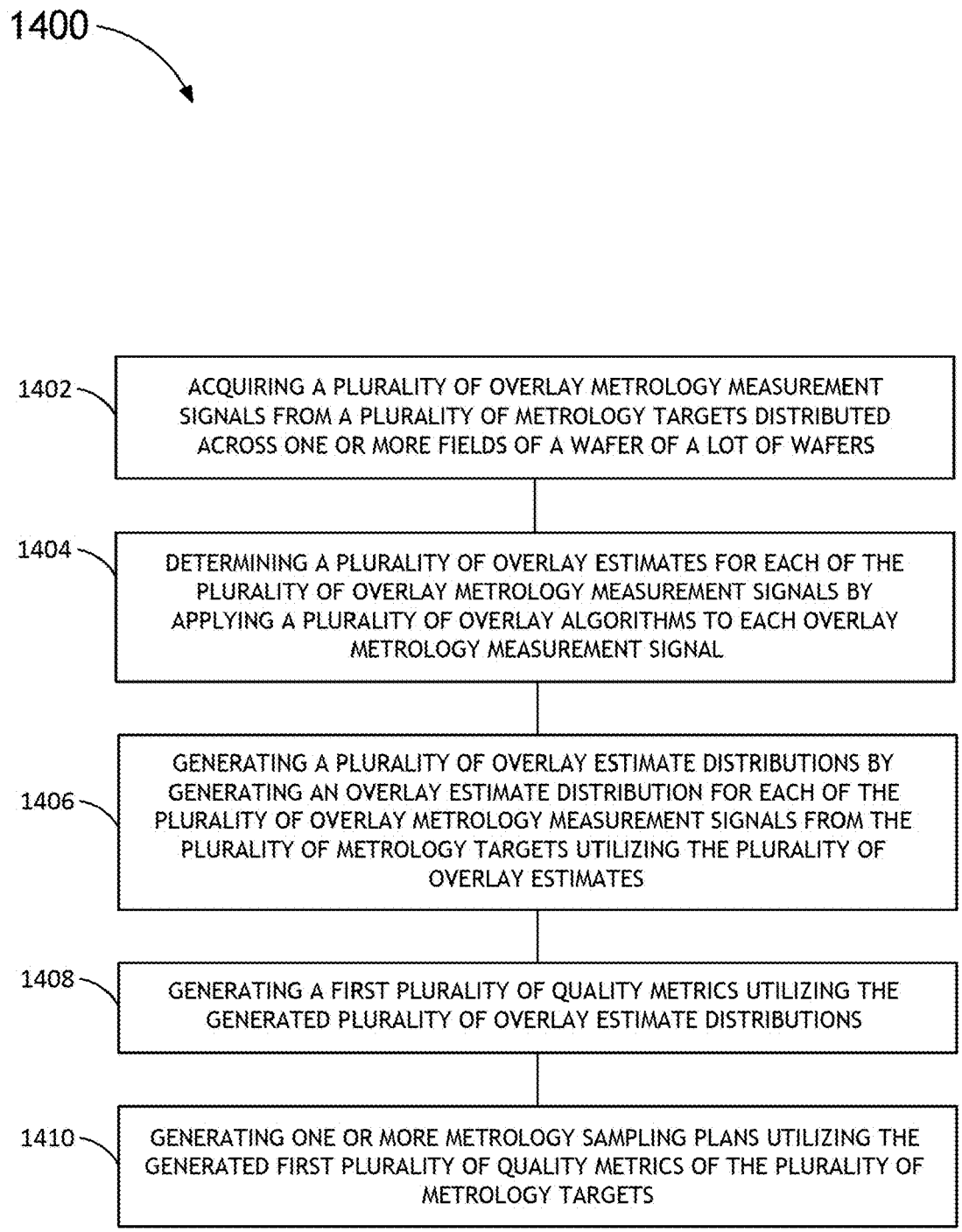
FIG. 14 illustrates a flow diagram of a method for generating one or more metrology sampling plans, in accordance with an alternative embodiment of the present invention.

FIG. 14 is a flow diagram illustrating steps performed in a method 1400 for generating a metrology sampling plan, in accordance with an embodiment of the present invention. Process 1400 is directed to generating a metrology sampling plan based on the generated quality metrics of process 700. In step 1402, a plurality of overlay metrology measurement signals from a plurality of metrology targets distributed across one or more fields of a wafer of a lot of wafers is acquired. In step 1404, a plurality of overlay estimates for each of the plurality of overlay metrology measurement signals is determined by applying a plurality of overlay algorithms to each overlay metrology measurement signal. In step 1406, a plurality of overlay estimate distributions is generated by generating an overlay estimate distribution for each of the plurality of overlay metrology measurement signals from the plurality of metrology targets utilizing the plurality of overlay estimates. In step 1408, a first plurality of quality metrics utilizing the generated plurality of overlay estimate distributions is generated.

In step 1410, one or more metrology sampling plans may be generated utilizing the generated first plurality of quality metrics of the plurality of metrology targets. In this regard, a sub-sampling plan or an alternate sampling plan may be selected based on the quality metric associated with the set of measured metrology targets. Upon identifying the new sampling plan, the system 500 may apply the sampling plan during metrology measurements of subsequent wafers of the lot of wafers.

In one embodiment, generating one or more metrology sampling plans utilizing the generated first plurality of quality metrics of the plurality of metrology targets to identify one or more low quality targets, wherein the one or more low quality targets are excluded from the generated one or more metrology sampling plan. In this regard, low target metrology targets may be identified via their corresponding quality metric (for the metrology scenario) and excluded from the sampling plan used for subsequent measurements.

Figure 15C:
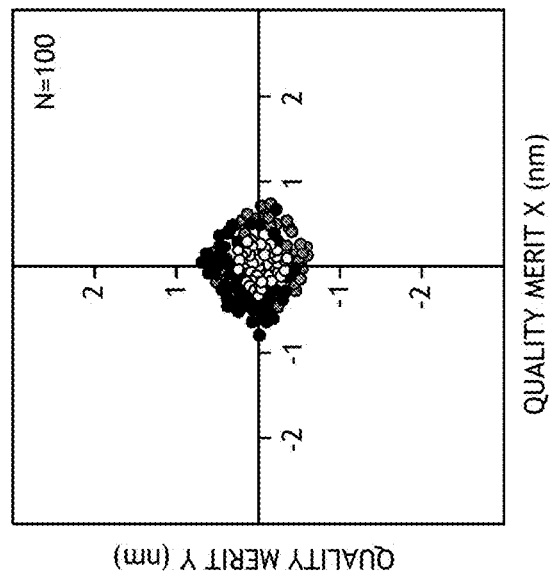
FIGS. 15A-15C illustrate sets of data depicting quality metric cloud data at varying levels of low quality target removal, in accordance with an alternative embodiment of the present invention.
Figure 15B:
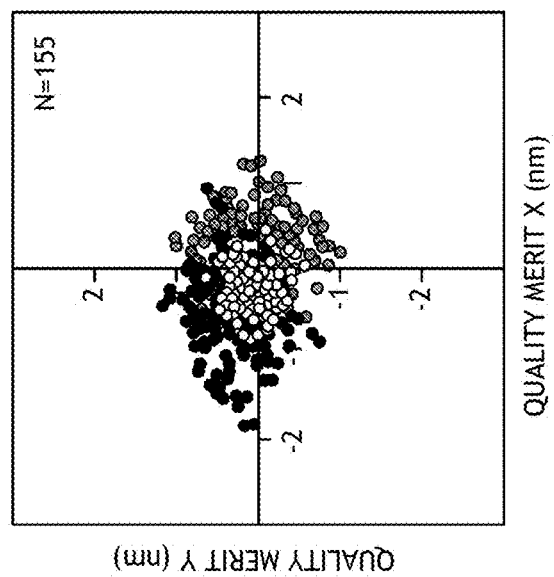
Figure 15A:
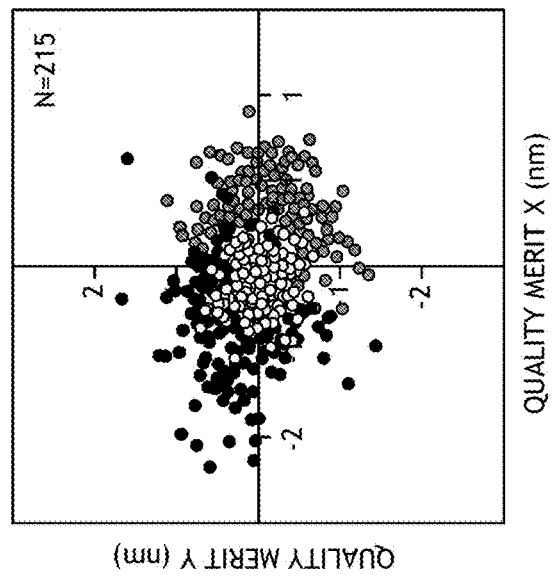
Figure 16B:
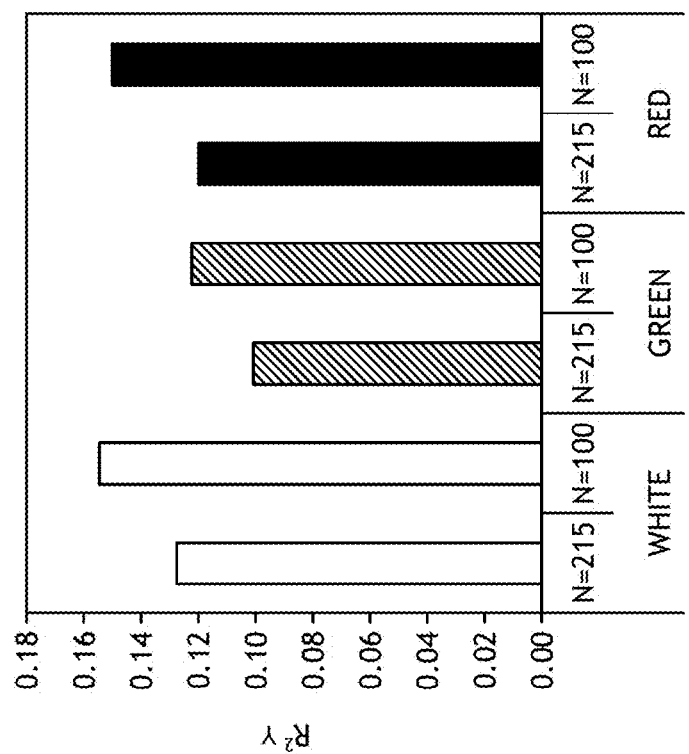
FIGS. 16A-16D illustrate sets of data depicting residual data and $R^2$ data at varying levels of low quality target removal, in accordance with an alternative embodiment of the present invention.
Figure 16A:
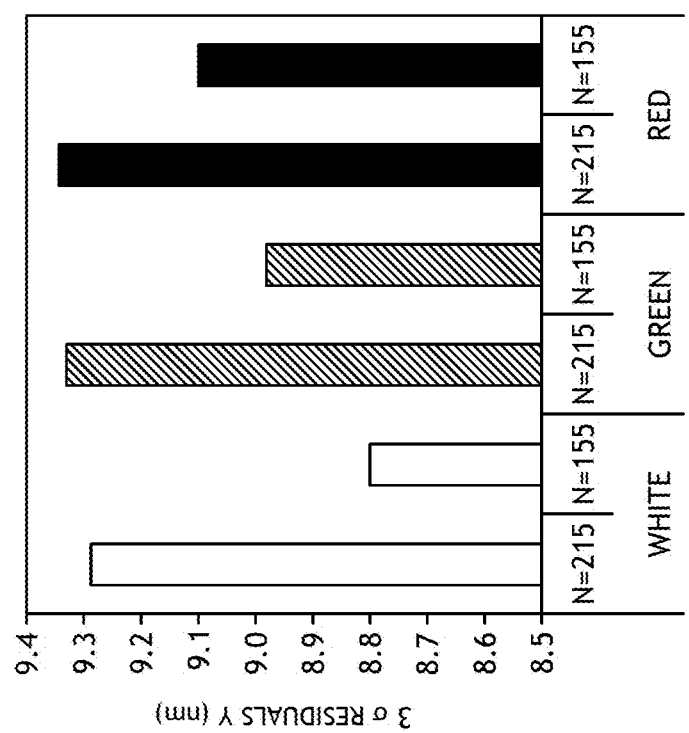
Figure 16D:
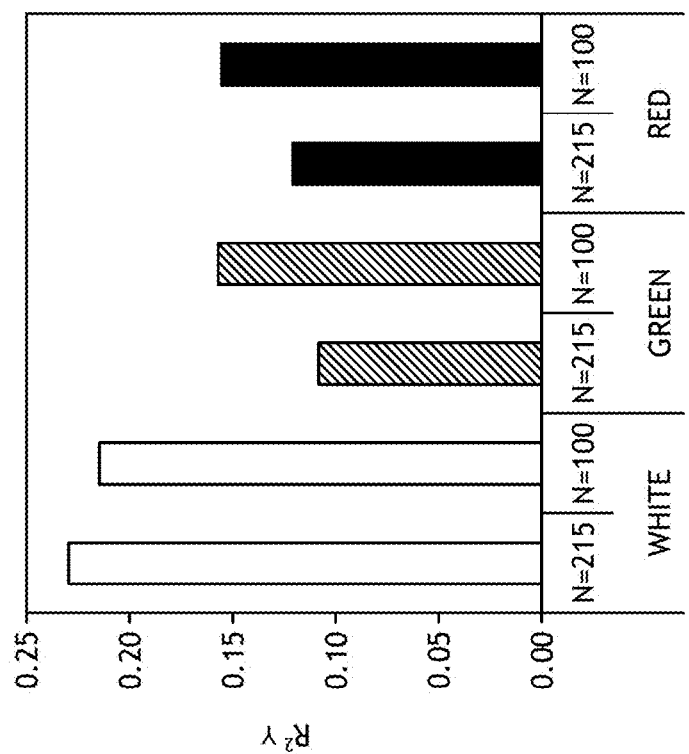
Figure 16C:
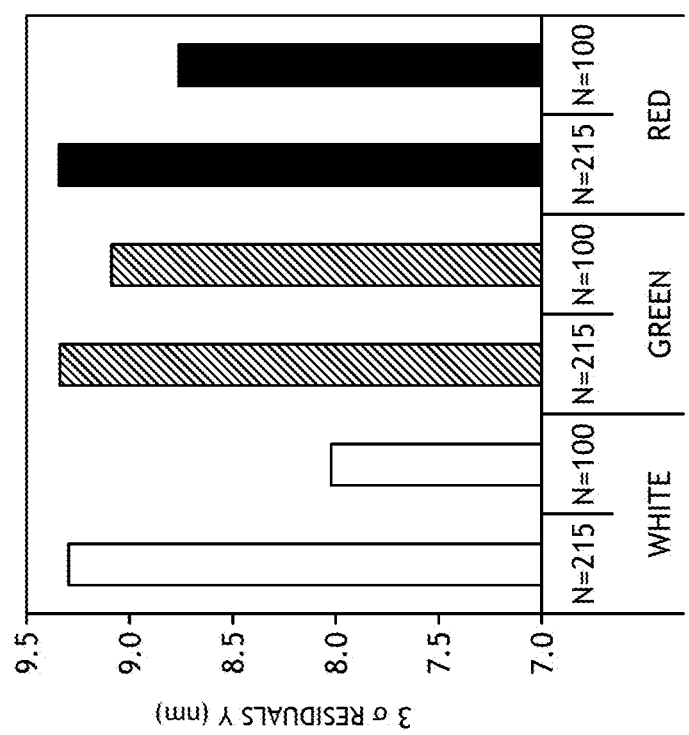
Figure 17A:
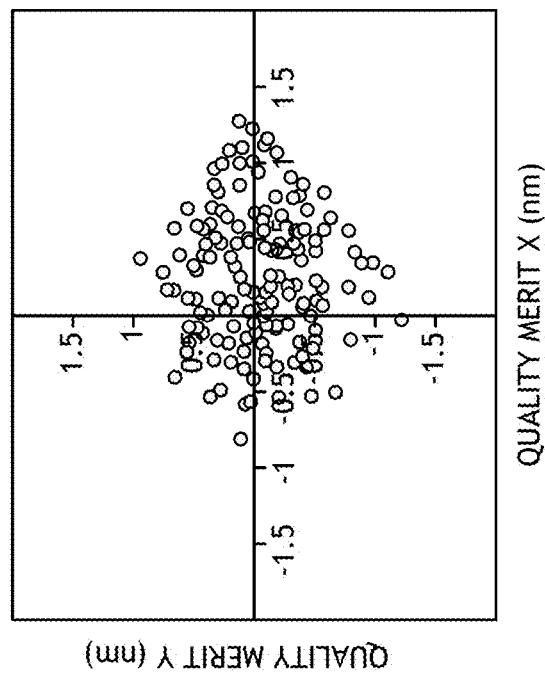
FIGS. 17A-17B illustrate sets of data depicting quality metric cloud data at with and without low quality target replacement, in accordance with an alternative embodiment of the present invention.
Figure 17B:
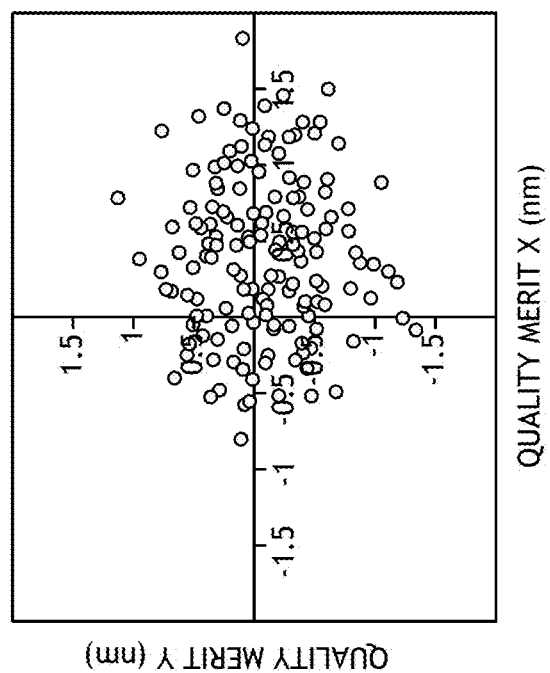

FIGS. 15A-15C illustrate a series of quality metric data for three different wavelengths of illumination. FIG. 15A depicts the quality metric values for three different wavelengths (white, red, and green) acquired from a set of overlay metrology measurement of 215 targets. FIG. 15B depicts the remaining quality metric values after the 60 targets having the lowest quality (i.e., 60 targets having largest quality metric magnitude) have been removed, leaving 155 targets for sampling (i.e., N=155 sampling). Further, FIG. 15C depicts the remaining quality metric values after 115 targets having the lowest quality value have been removed, leaving 100 targets for sampling (i.e., N=100 sampling). Applicant notes that, while the description above discusses the target selection in terms of excluding a set of low quality targets, it is also straightforward to select a set of high quality targets for inclusion in the sampling plan.

FIGS. 16A-16D illustrate residual and $R^2$ values for the initial overlay sampling of N=215 and the subsequent adjusted samplings of N=155 and N=100 in the y-direction. It is straightforward to observe in FIGS. 16A-16D that in all three wavelengths sampled the residual magnitude is decreased for N=155 and N=100 relative to the initial N=215 sampling. Likewise, FIGS. 16A-16D display a universal increase in $R^2$ for each sub-sampling plan (e.g., N=100 and N=155) at each wavelength. Those skilled in the art will recognize that these improved residual and $R^2$ characteristics in turn will result in improved process tool correctables that may be fed to an associated process tool.

In one embodiment, generating one or more metrology sampling plans utilizing the generated first plurality of quality metrics of the plurality of metrology targets to identify one or more low quality targets, wherein the one or more low quality targets are excluded from the generated one or more metrology sampling plans and one or more additional metrology targets located proximate to the one or more low quality targets are utilized to replace the one or more low quality targets. In this regard, low target metrology targets may be identified via their corresponding quality metric (for the metrology scenario) and excluded from the sampling plan used for subsequent measurements, while additional targets located near the excluded low quality target may be inserted into the sampling plan utilized on subsequent wafers of the lot.

Figure 18B:
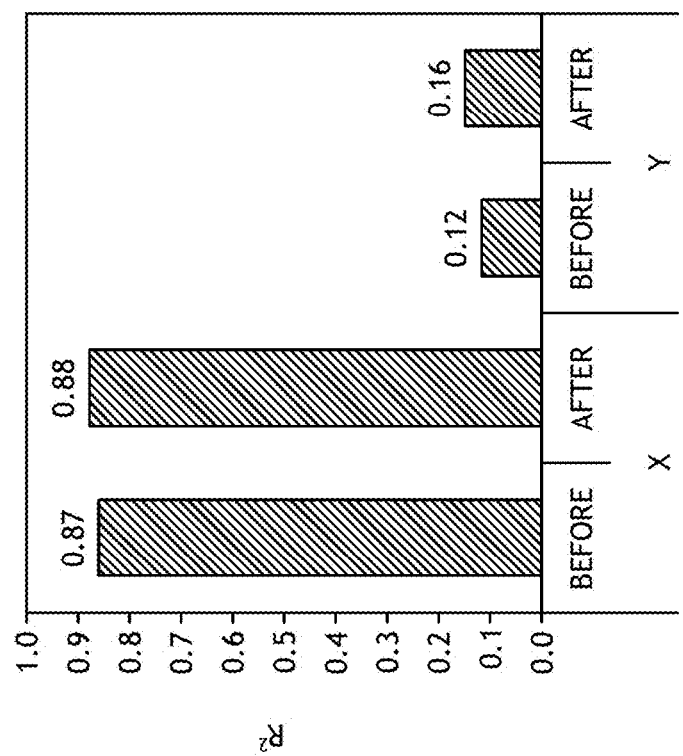
FIGS. 18A-18B illustrate sets of data depicting residual data and $R^2$ data with and without low quality target replacement, in accordance with an alternative embodiment of the present invention.
Figure 18A:
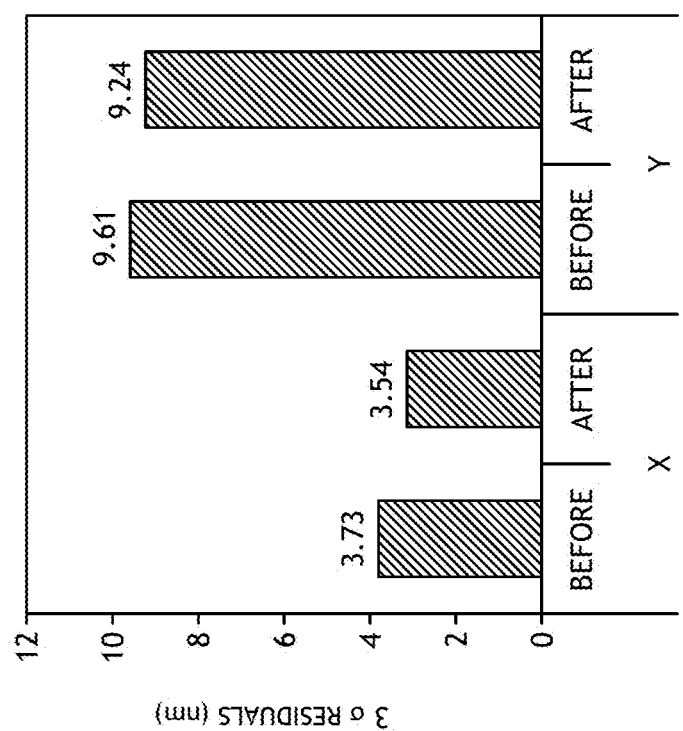

FIGS. 18A-18B illustrate residual and $R^2$ values for the x- and y-direction for the initial overlay sampling and subsequent adjusted samplings wherein low quality targets were replaced with targets proximately located to the excluded low quality targets. FIG. 8A illustrates a reduced residual level in both the x- and y-directions upon replacement of low quality targets with proximately located targets. Likewise, FIG. 8B illustrates an increase in $R^2$ value upon replacement of low quality targets with proximately located targets. Again, those skilled in the art will recognize that these improved residual and $R^2$ characteristics in turn will result in improved process tool correctables that may be fed to an associated process tool.

Figure 19:
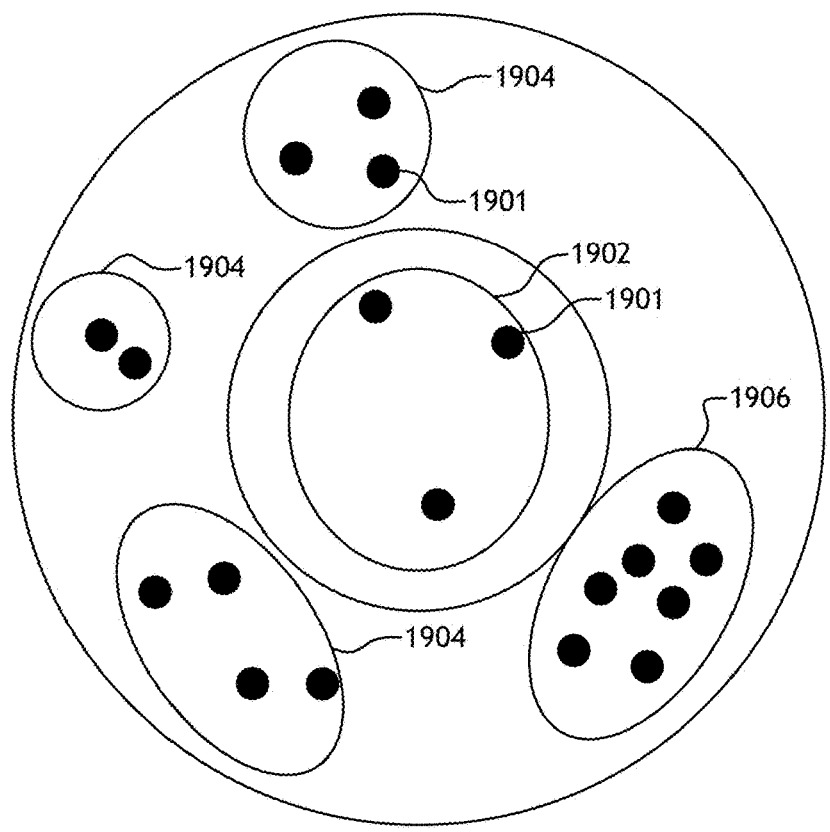
FIG. 19 illustrates a top view of multiple target quality zones, in accordance with an alternative embodiment of the present invention.

The process 1400 may further include the step of identifying a plurality of quality zones of the wafer utilizing the first plurality of quality metrics, each of the quality zones including a plurality of metrology targets having substantially similar quality levels. For example, as shown in FIG. 19, a first quality zone 1902-1906 may be identified such that all targets 1901 included therein are of a substantially the same quality. In a further embodiment, the sampling rate implement during a subsequent overlay metrology process may be a function of the given identified quality zone. For instance, the number of targets sampled within zones 1902, 1904, and 1906 may depend on the quality level of the targets contained with those zones. In a further aspect, the initial sampling plan the metrology measurement process may include measuring a full wafer map, measuring a full lot map, or measuring a sub-lot of wafers.

After defining the first wafer's sampling plan based on its quality metric, the identified sampling plan may be applied to the next wafer, while also serving a per-defined constraint. For example, the constraint may be constructed by a few sub-constraints, and each sub-constraint will raise the need for a minor change in the sampling plan (e.g replace a site with a different one). This process may continue on to the subsequent lots cumulatively. The constraints may be based on the quality metric of the measured wafer/wafers statistics (e.g standard deviation, average, range etc.) while taking into account the sampling amount.

Referring now to FIGS. 20A through 20F a method and system for providing process signature mapping is described, in accordance with embodiments of the present invention. In this regard, a process signature mapping solution, hereinafter referred to as a 'process signature mapper' may aid in improving patterning process control in semiconductor device fabrication.

Figure 20A:
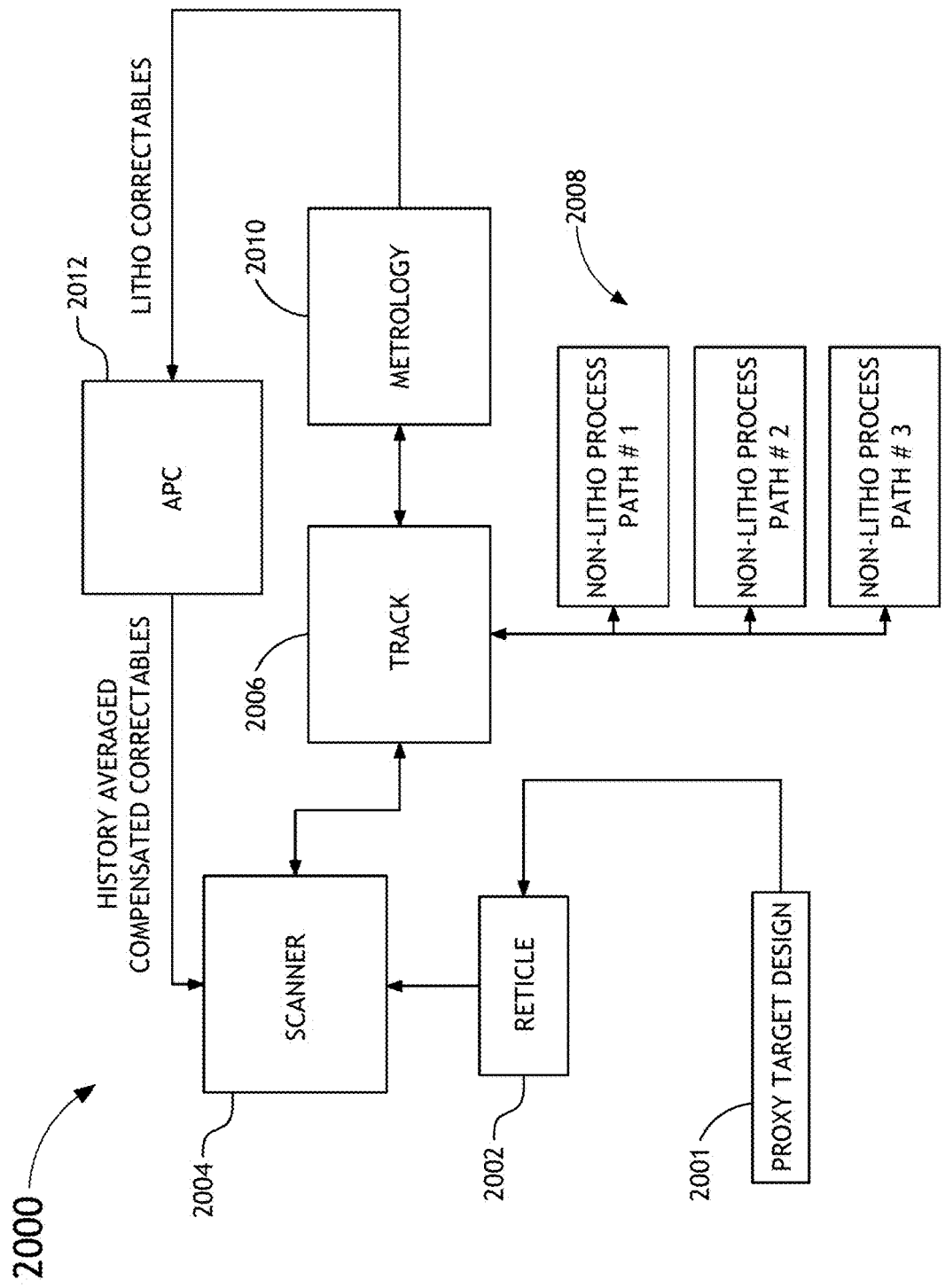
FIG. 20A illustrates a block diagram view of a lithography control loop, in accordance with an alternative embodiment of the present invention.

FIG. 20A illustrates one embodiment of a lithography process control loop. The lithography process control loop may include, but is not limited to, a reticle 2002, a scanner 2004, a process tracking module 2006 configured to track multiple non-lithographic process paths 2008, a metrology system 2010, and an advanced process control (APC) system 2012. In a typical lithography process control loop 2000, metrology measurements 2010, which are intended to be fed back into the control loop of the lithography process, are performed on metrology targets of a wafer which have been exposed to lithography process on both the previous and current process layer (as well other processes, such as etch and polish on previous layers). Although the objective of the metrology process 2010 is to enable correction of lithography drifts, the actual measured overlay may be biased as a result of effects related to the non-lithographic processes 2008 and will depend on the historical path of the specific wafer. It is recognized herein that biases are considered metrology ambiguity, as described previously herein. In the current state of the art, metrology data collected from wafers from an arbitrary previous process path are used to calculate history averaged correctables by the APC system 2012, which may then be fed into the lithographic exposure process (i.e., the scanner 2004). One objective of the current invention is to quantify the dependence of the measured overlay on the specific processing path of the wafer. This procedure is termed process signature mapping.

Figure 20B:
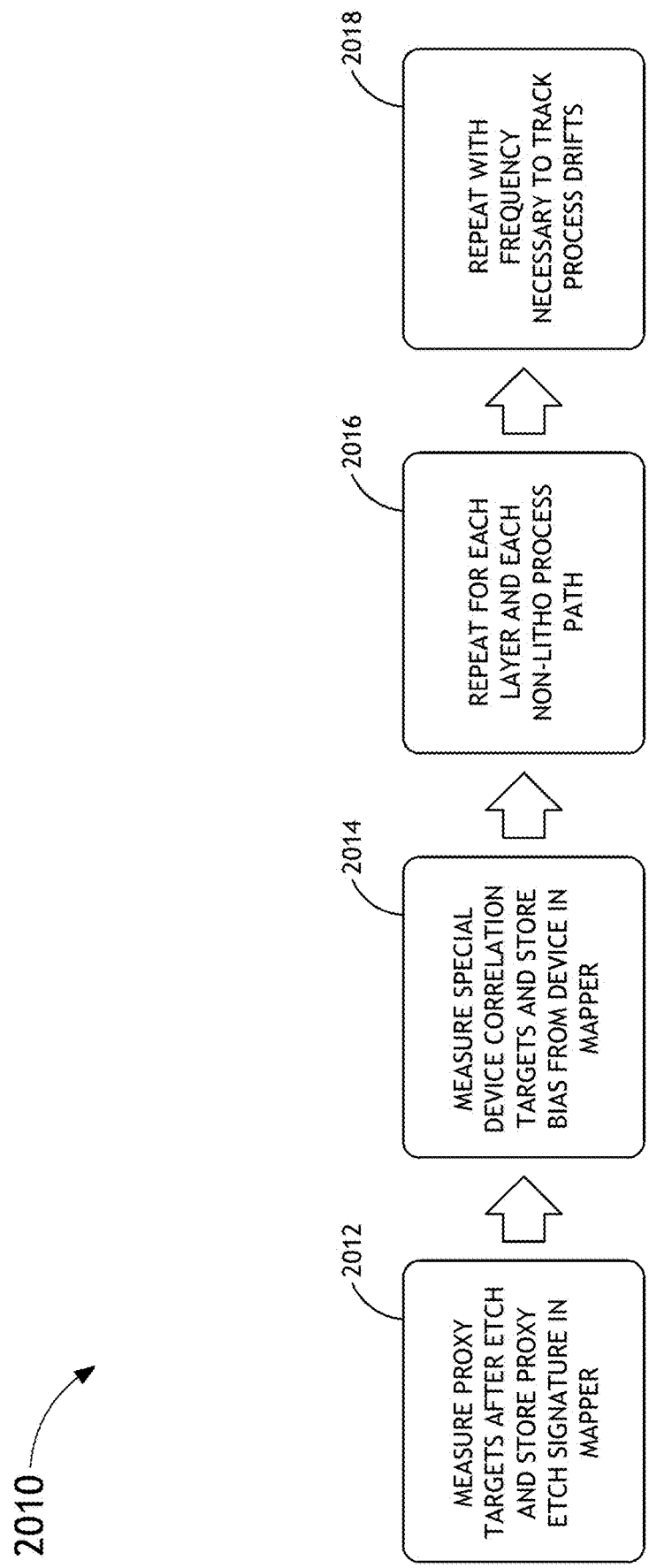
FIG. 20B illustrates a flow diagram of a method for providing process signature mapping, in accordance with an alternative embodiment of the present invention.

FIG. 20B illustrates a process flow for process signature mapping, in accordance with one embodiment of the present invention. In step 2012, following a lithography process, a plurality of proxy targets formed on a reticle (e.g., test reticle or product reticle) are measured using an overlay metrology process (e.g., imaging metrology or scatterometry) both before an etching process and after an etching process. In this regard, as shown in FIG. 20C, a first process signature 2026 as a function of position across the wafer may be determined by comparing (e.g., determining a difference between) a first set of metrology results 2022 acquired from the plurality of proxy targets following a lithography process and prior to a first etching process of the wafer and at least a second set of metrology results 2024 acquired from the plurality of proxy targets following the first etching process of the wafer.

Figure 20C:
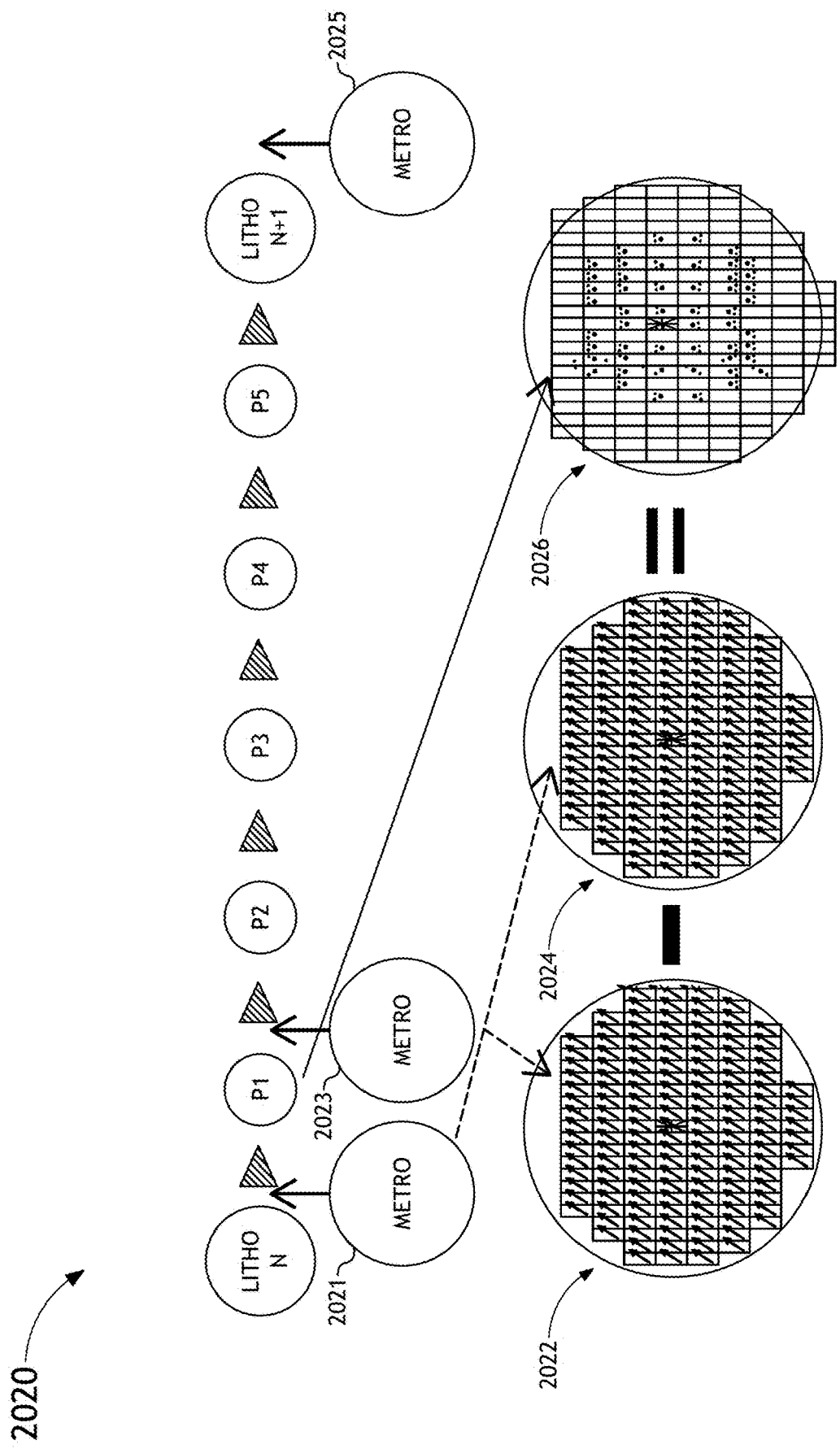
FIG. 20C illustrates a conceptual view of post-lithography/post-etching bias as a function of location on a wafer, in accordance with an alternative embodiment of the present invention.

Further, the first process signature may be correlated with a specific process path, as shown in FIG. 20C. In this regard, the difference between the two metrology measurements 2021 and 2023 as a function of location across the wafer (previously referred to as DI-FI bias) may be tagged to specify the particular process path including, but not limited to process sequence, identification of specific process tools, time stamp and the like.

Figure 20D:
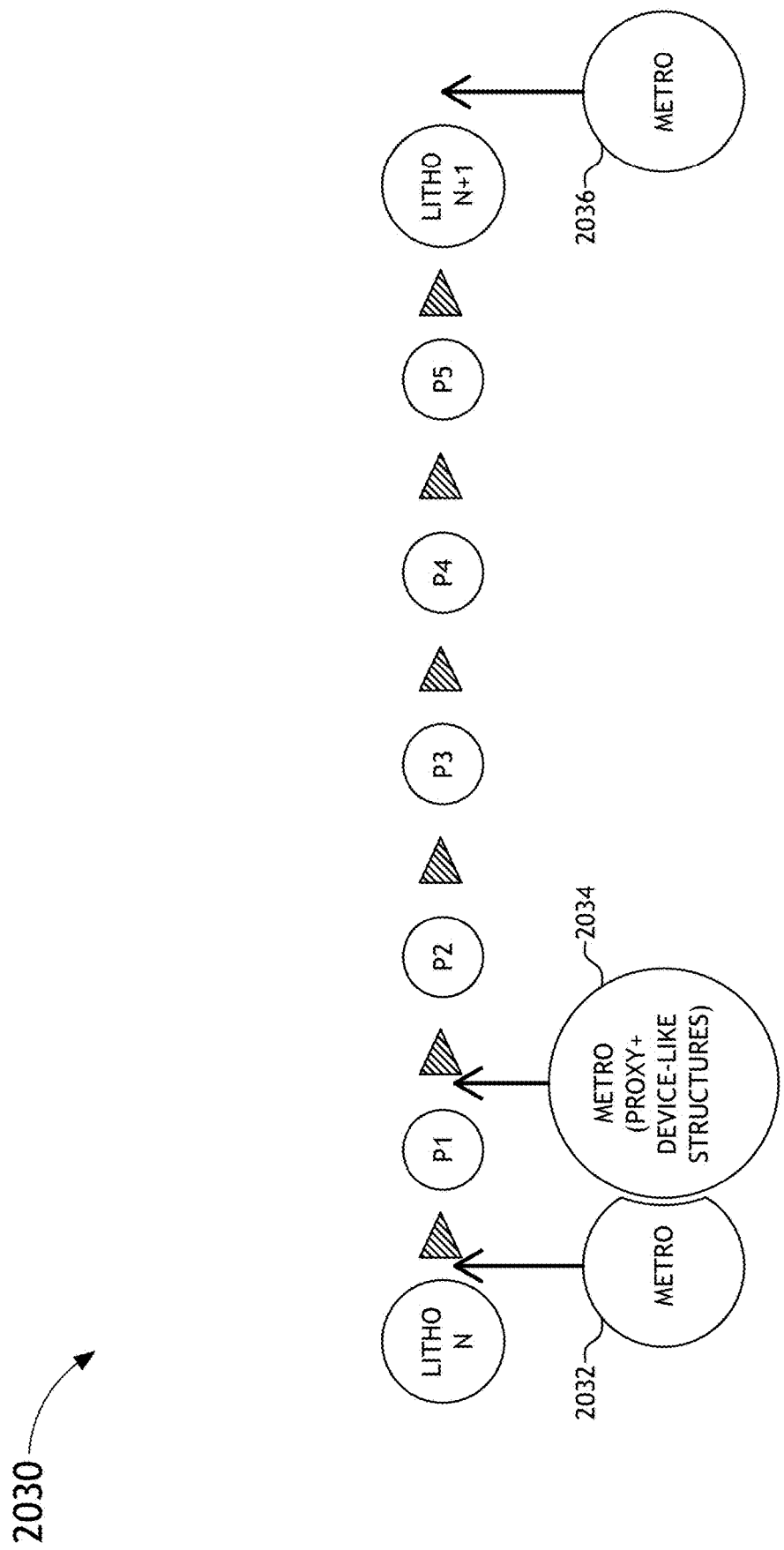
FIG. 20D illustrates a conceptual view of device correlation metrology performed to quantify the bias between metrology structure and a device, in accordance with an alternative embodiment of the present invention.

In step 2014, a device correlation bias may be measured following the first etching process. In this regard, the device correlation bias may be measured following the first etching process by performing a first set of metrology measurements on the plurality of device correlation targets of the wafer. It is noted herein that the device correlation bias of the present invention represents the bias between a metrology structure and a device of the wafer, with the metrology features typically being of different dimensions (substantially larger) than the device features. In a further embodiment, as shown in FIG. 20D, the device correlation bias may be measured by performing metrology measurements 2034 (e.g., CD-SEM or AFM measurements) on the device correlation targets of the wafer, which contain features of both device-like and metrology-like dimensions. Further, this metrology step is performed after etch. Examples of device correlation measurements are generally described in "Improved Overlay Metrology Device Correlation on 90-nm Logic Processes" by Ueno et. al, Metrology, Inspection, and Process Control for Microlithography XVIII, edited by Silver, Richard M. SPIE, Volume 5375, pp. 222-231 (2004), which is incorporated herein by reference in its entirety.

Further, a process signature map may be generated utilizing the determined first etch signature and each of the additional etch signatures and the first measured device correlation bias and each additional device correlation bias. In this regard, the results of step 2012 and/or step 2014 may be stored into memory of the system and used to form the process signature map database.

In step 2016, the steps 2012 and 2014 may be repeated for each layer and for each non-lithographic process path of the control loop. In this regard, step 2016 may include determining an additional etch signature for each additional process layer and for each additional non-lithographic process path of the wafer as a function of position across the wafer. Further, step 2016 may include measuring an additional device correlation bias following each additional process layer and each additional non-lithographic process path of the wafer. Since the list of possible permutations of process paths can be very large, the set of process paths chosen for characterization is defined based on the matching and intrinsic variability within a family of process tools. If the process tools demonstrate good matching, then measurement of independent process paths for each matched tool may not be required. In a further step, the process may be periodically updated in order to keep the process signature database current, allowing for effect monitoring of process drift.

Figure 20E:
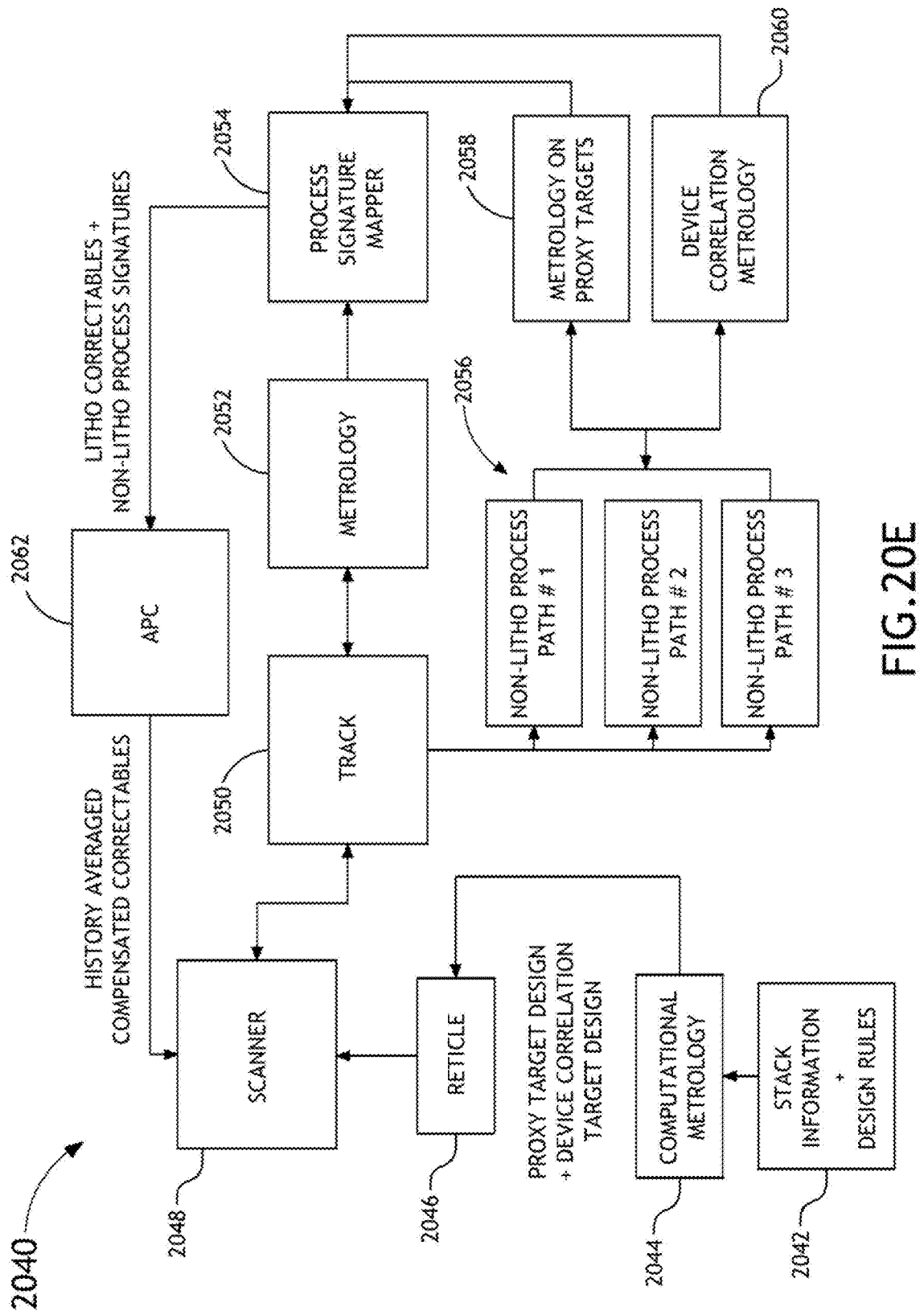
FIG. 20E illustrates a block diagram view of a lithography control loop equipped with a process signature mapper, in accordance with an alternative embodiment of the present invention.

FIG. 20E illustrates an implementation of the process signature mapper database in a lithography process control loop, in accordance with one embodiment of the present invention. The process control loop 2040 may include, but is not limited to, a stack information and design rules module 2042, computational metrology module 2044, a reticle 2046 configured for receiving proxy target design and device correlation target design information, a scanner 2048, a tracking module 2050 configured to track multiple non-lithographic processes 2056, a metrology system 2052, the process signature mapper 2054 configured to receive metrology results from the proxy targets 2058 and the device correlation targets 2060, and an APC 2062.

Once the process signature mapper dataset has been obtained, it may be utilized in the APC control loop 2062. As shown in FIG. 20E, metrology data is delivered to the process signature mapper 2054, which implements process corrections which are path specific per lot or per wafer. This corrected data is then transmitted to the APC loop 2062 which generates history averaged correctables, wherein the history averaged correctable are generated using methods known to those skilled in the art. In this manner, the process signature mapper module 2054 should be compatible with the existing APC infrastructure of currently existing fabrication facilities. In a general sense, the path dependent process signature, as calculated by the process signature mapper 2054, may be stored in the form of a process bias as a function of field and wafer location, or more specifically, in the form of standard correctables, associated with the degrees of freedom of correction of the process tool.

Figure 20F:
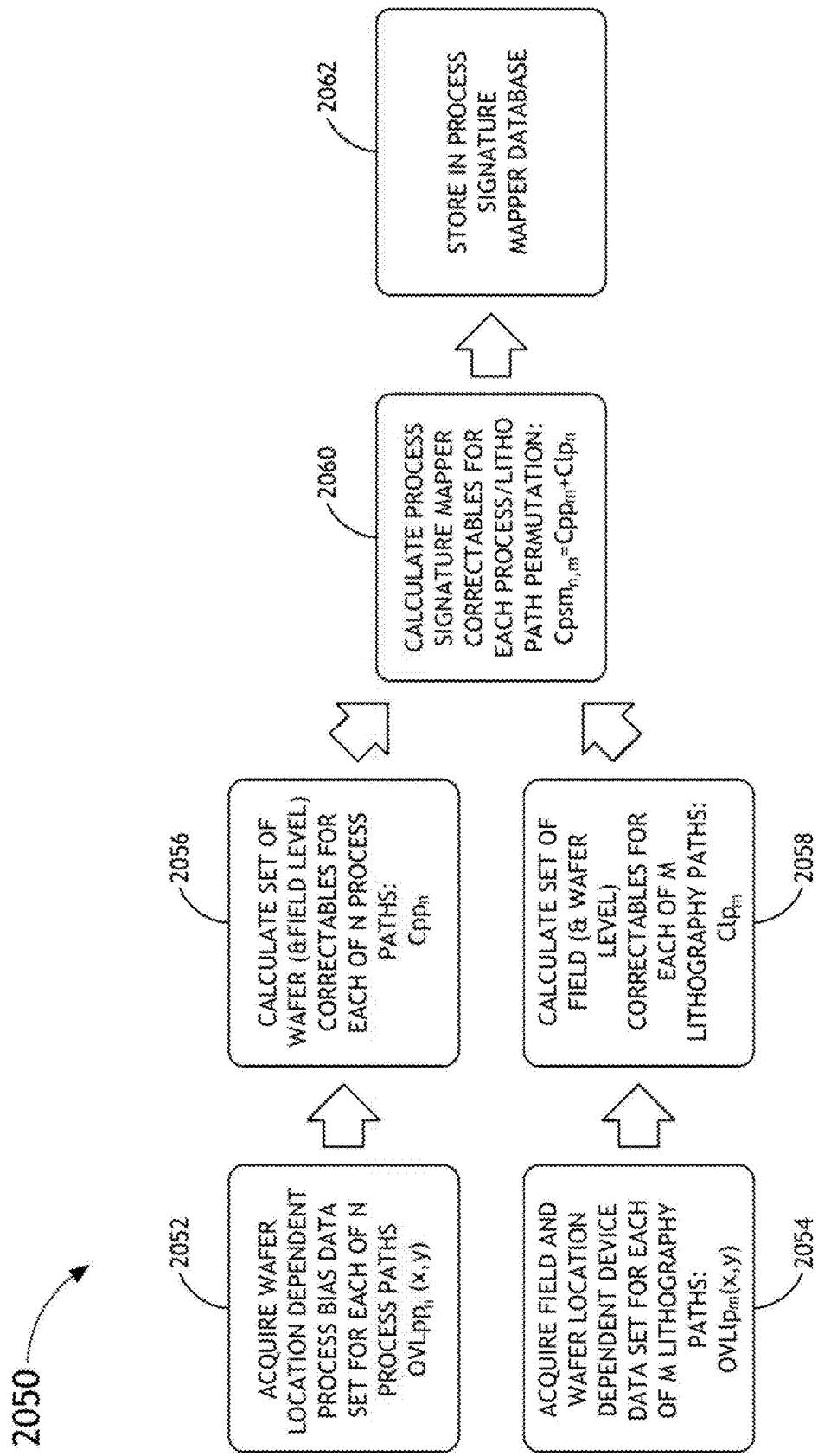
FIG. 20F illustrates a flow diagram of a method for generating process signature mapper correctables, in accordance with an alternative embodiment of the present invention.

FIG. 20F illustrates an implementation of the process signature mapper, in accordance with an embodiment of the present invention. Knowing all of the correction terms, it is possible to write an equation for the given device representing overlay at any point (x,y) on the wafer based on the calibration data generated from the measurement of proxy targets, which were measured post processing for each of n process paths, $OVLpp_n(x,y)$ (step 2052) and the measurement of device correlation targets after etch on CD-SEM or AFM. In the simplest case, the device correlation correction is a constant offset independent of wafer or field location or process path due to feature size dependence of the processing characteristics. However, in the more general case, the wafer and field location as well as the lithographic processing path need to be taken into account. By way of example, if the bias between device sized features and metrology sized features is due to scanner aberration induced pattern placement errors, then this bias will likely vary across the slit of the scanner. Hence, for each of the m lithography paths, the device correlation data, $OVLlp_m(x,y)$ needs to be collected (step 2054). In an alternative embodiment, the device correlation data may even be measured for each of the non-lithography process paths. In each case, the next step is to generate a standard set of correctables, $Cpp_n$ and $Clp_m$ (step 2056 and step 2058) from each of the specific data sets by conventional exposure tool correctables modeling as is known in the art. Correctables modeling is generally described in "Fundamental Principles of Optical Lithography" by Chris Mack, Wiley & sons, 2007, which is incorporate herein by reference in its entirety. In step 2060, the process signature mapper correctables for each process/lithography path permutation are generated, represented by:

$$Cpsm_{n,m} = Cpp_m + Cpp_n \quad \text{(Eq. 8)}$$

This data is then stored in the process signature mapper database 2062, as shown in FIG. 20F. It should be pointed out that the correctables generation procedure described below may include a number of different possible modeling scenarios. For instance, the correctables may include only the standard set of linear wafer and field correctables, of translation in x and y, wafer and field level rotation and wafer and field level magnification. Alternately, it may include higher order terms such as trapezoid, and other higher order wafer and field terms, dependent on the model of exposure tool and its degrees of freedom of correction. For the process correctables, it may be appropriate to generate specific correctables which most efficiently described the associated process biases, irrespective of the lithography correctables.

A typical production metrology and process control scenario will now be described. At this stage, metrology is performed on a product wafer. Sampling may be according to varying sample plans, depending on the correctables model and APC methodology. The product wafer data $OVLpw_{m,n}$ is then modeled by standard methods as described above to generate product wafer correctables, $Cpw_{m,n}$ which came from lithography path m and process path n, and is then sent to the process signature mapper. The process signature mapper subtracts the process signature mapper correctables, $Cpsm_{n,m}$ from the current product wafer correctables to generate corrected product wafer correctables $C'pw_{n,m}$, given by:

$$C'pw_{n,m} = Cpw_{n,m} - Cpsm_{n,m} \tag{Eq. 9}$$

The corrected product wafer correctables are then transmitted to the APC system and the process control proceeds in a conventional fashion such as by means of an exponential window moving average method or any other suitable technique known in the art.

All of the methods described herein may include storing results of one or more steps of the method embodiments in a storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. For example, after the method generates the sub-sampling plan, the method may include storing the sub-sampling plan in a metrology recipe in a storage medium. In addition, results or output of the embodiments described herein may be stored and accessed by a metrology system such as a CD SEM such that a metrology system can use the sub-sampling plan for metrology assuming that the output file can be understood by the metrology system. Furthermore, the results may be stored "permanently," "semi-permanently," temporarily, or for some period of time. For example, the storage medium may be random access memory (RAM), and the results may not necessarily persist indefinitely in the storage medium.

It is further contemplated that each of the embodiments of the method described above may include any other step(s) of any other method(s) described herein. In addition, each of the embodiments of the method described above may be performed by any of the systems described herein.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations will typically employ optically-oriented hardware, software, and or firmware.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically mateable and/or physically interacting components and/or wirelessly interactable and/or wirelessly interacting components and/or logically interacting and/or logically interactable components.

While particular aspects of the present subject matter described herein have been shown and described, it will be apparent to those skilled in the art that, based upon the teachings herein, changes and modifications may be made without departing from the subject matter described herein and its broader aspects and, therefore, the appended claims are to encompass within their scope all such changes and modifications as are within the true spirit and scope of the subject matter described herein.

Furthermore, it is to be understood that the invention is defined by the appended claims.

Although particular embodiments of this invention have been illustrated, it is apparent that various modifications and embodiments of the invention may be made by those skilled in the art without departing from the scope and spirit of the foregoing disclosure. Accordingly, the scope of the invention should be limited only by the claims appended hereto.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed:

1. A computer-implemented method for providing a quality metric suitable for improving process control in a semiconductor wafer fabrication process comprising:
   acquiring a plurality of overlay metrology measurement signals from a plurality of metrology targets distributed across one or more fields of a wafer, each overlay metrology measurement signal corresponding with a metrology target of the plurality of metrology targets, the plurality of overlay metrology measurement signals acquired utilizing a first measurement recipe;
   determining a plurality of overlay estimates for each of the plurality of overlay metrology measurement signals by applying a plurality of overlay algorithms to each overlay metrology measurement signal, wherein a first overlay estimate is determined with a first overlay algorithm of the plurality of overlay algorithms and an additional overlay estimate is determined with an additional overlay algorithm of the plurality of overlay algorithms for each of the plurality of the overlay metrology measurement signals;
   generating a plurality of statistical overlay estimate distributions by generating a statistical overlay estimate distribution for each of the plurality of overlay metrology measurement signals from the plurality of metrology targets, wherein a first overlay estimate distribution is formed utilizing a first plurality of overlay estimates and an additional overlay estimate distribution is formed utilizing an additional plurality of overlay estimates; and
   generating a first plurality of quality metrics based on a plurality of spans of the generated plurality of statistical overlay estimate distributions, wherein a first quality metric corresponds with one overlay estimate distribution generated for a first metrology target via the plurality of overlay algorithms, wherein the first quality metric is calculated based on a span of a corresponding overlay estimate distribution, wherein one or more of the quality metrics are proportional to an asymmetry-induced overlay inaccuracy in an overlay metrology signal.

2. The method of claim 1, wherein acquiring a plurality of overlay metrology measurement signals from a plurality of metrology targets distributed across one or more fields of a wafer comprises:
   performing an overlay metrology measurement on a plurality of metrology targets distributed across one or more fields of a wafer.

3. The method of claim 1, further comprising:
   performing a tool induced shift (TIS) correction to at least some of the acquired plurality of overlay metrology measurement signals.

4. The method of claim 1, wherein each of the plurality of generated quality metrics is configured to identify an overlay deviation from a metrology target having substantially symmetric target structures.

5. The method of claim 1, further comprising:
   identifying one or more metrology targets of the plurality of metrology targets having a quality metric larger than a selected outlier level along at least one direction from a distribution of the plurality of quality metrics generated for the plurality of metrology targets;
   determining a corrected plurality of metrology targets, wherein the corrected plurality of metrology targets excludes the identified one or more metrology targets having a quality metric deviating beyond a selected outlier level from the plurality of metrology targets; and
   calculating a set of correctables utilizing the determined corrected plurality of metrology targets.

6. The method of claim 5, further comprising:
   transmitting the set of correctables to one or more process tools.

7. The method of claim 1, further comprising:
   acquiring at least an additional plurality of overlay metrology measurement signals from the plurality of metrology targets distributed across the one or more fields of the wafer, each overlay metrology measurement signal of the at least an additional plurality of overlay metrology measurement signals corresponding with a metrology target of the plurality of metrology targets, the at least an additional plurality of overlay metrology measurement signals acquired utilizing at least an additional measurement recipe;
   determining at least an additional plurality of overlay estimates for each of the at least an additional plurality of overlay measurement signals by applying the plurality of overlay algorithms to each overlay measurement signal of the at least an additional plurality of measurement signals, wherein a first overlay estimate of the at least an additional plurality of overlay estimates is determined with a first overlay algorithm of the plurality of overlay algorithms and an additional overlay estimate of the at least an additional plurality of overlay estimates is determined with an additional overlay algorithm of the plurality of overlay algorithms;
   generating at least an additional plurality of statistical overlay estimate distributions by generating a statistical overlay estimate distribution for each of the at least an additional plurality of overlay measurement signals from the plurality of metrology targets;
   generating at least an additional plurality of quality metrics based on a plurality of spans of the generated at least an additional plurality of statistical overlay estimate distributions, wherein a first quality metric of the at least an additional plurality of quality metrics corresponds with one overlay estimate distribution of the generated at least an additional plurality of overlay estimate distributions; and
   determining a process measurement recipe by comparing a distribution of the first plurality of quality metrics associated with the first measurement recipe to a distribution of the at least an additional plurality of quality metrics associated with the at least one additional measurement recipe.

8. The method of claim 7, wherein the determining a process measurement recipe by comparing a distribution of the first plurality of quality metrics associated with the first measurement recipe to a distribution of the at least an additional plurality of quality metrics associated with the at least one additional measurement recipe comprises:
   determining an optimum measurement recipe by comparing a distribution of the first plurality of quality metrics associated with the first measurement recipe to a distribution of the at least an additional plurality of quality metrics associated with the at least one additional measurement recipe, the optimum measurement recipe associated with a plurality of quality metrics of the first plurality of metrics and the at least an additional plurality of metrics having a substantially minimum distribution in at least one direction.

9. The method of claim 7, wherein at least one of the first measurement recipe or the at least an additional measurement recipe comprise:
    at least one of a wavelength of illumination, a filter configuration, a direction of illumination, a focus position, or polarization configuration.

10. A computer-implemented method for determining a quality metric suitable for improving process control in a semiconductor wafer fabrication process comprising:
    acquiring a metrology measurement signal from a metrology target of a wafer;
    determining a plurality of overlay estimates for the metrology target by applying a plurality of overlay algorithms to the acquired metrology measurement signal from the metrology target, wherein a first overlay estimate is determined for the metrology target with a first overlay algorithm of the plurality of overlay algorithms and an additional overlay estimate is determined for the metrology target with an additional overlay algorithm of the plurality of overlay algorithms, wherein the first overlay algorithm is different from the additional overlay algorithm;
    generating a statistical overlay estimate distribution based on the plurality of overlay estimates; and
    generating a quality metric for the metrology target based on a span of the generated statistical overlay estimate distribution, wherein the quality metric is indicative of variation of the overlay estimates as a function of the plurality of overlay algorithms applied to the metrology measurement signal acquired from the metrology target, the quality metric configured to be non-zero for an asymmetric overlay measurement signal acquired from the metrology target and is proportional to an asymmetry-induced overlay inaccuracy in the metrology measurement signal acquired from the metrology target.

11. A computer-implemented method for generating a metrology sampling plan comprising:
    acquiring a plurality of overlay metrology measurement signals from a plurality of metrology targets distributed across one or more fields of a wafer, each overlay metrology measurement signal corresponding with a metrology target of the plurality of metrology targets;
    determining a plurality of overlay estimates for each of the plurality of overlay metrology measurement signals by applying a plurality of overlay algorithms to each overlay metrology measurement signal, wherein a first overlay estimate is determined with a first overlay algorithm of the plurality of overlay algorithms and an additional overlay estimate is determined with an additional overlay algorithm of the plurality of overlay algorithms for each of the plurality of the overlay metrology measurement signals;
    generating a plurality of statistical overlay estimate distributions by generating a statistical overlay estimate distribution for each of the plurality of overlay metrology measurement signals from the plurality of metrology targets, wherein a first overlay estimate distribution is formed utilizing a first plurality of overlay estimates and an additional overlay estimate distribution is formed utilizing an additional plurality of overlay estimates;
    generating a first plurality of quality metrics based on a plurality of spans of the generated plurality of statistical overlay estimate distributions, wherein a first quality metric corresponds with one overlay estimate distribution generated for a first metrology target via the plurality of overlay algorithms, wherein the first quality metric is calculated based on a span of a corresponding overlay estimate distribution, wherein one or more of the quality metrics are proportional to an asymmetry-induced overlay inaccuracy in an overlay metrology signal; and
    generating one or more metrology sampling plans utilizing the generated first plurality of quality metrics of the plurality of metrology targets.

12. The method of claim 11, wherein the generating one or more metrology sampling plans utilizing the generated first plurality of quality metrics of the plurality of metrology targets comprises:
    generating one or more metrology sampling plans utilizing the generated first plurality of quality metrics of the plurality of metrology targets to identify one or more low quality targets, wherein the one or more low quality targets are excluded from the generated one or more metrology sampling plan.

13. The method of claim 11, wherein the generating one or more metrology sampling plans utilizing the generated first plurality of quality metrics of the plurality of metrology targets comprises:
    generating one or more metrology sampling plans utilizing the generated first plurality of quality metrics of the plurality of metrology targets to identify one or more low quality targets of the wafer, wherein the one or more low quality targets are excluded from the generated one or more metrology sampling plans and one or more additional metrology targets located proximate to the one or more low quality targets are utilized to replace the one or more low quality targets.

14. The method of claim 11, further comprising:
    identifying a plurality of quality zones of the wafer utilizing the first plurality of quality metrics, each of the quality zones including a plurality of metrology targets having substantially similar quality levels.

15. The method of claim 14, wherein a metrology sampling rate at one or more locations across the wafer is defined by each of the plurality of quality zones.

16. The method of claim 11, further comprising:
    performing one or more metrology measurements on a subsequent wafer utilizing the generated sampling plan.

17. A system for providing a quality metric suitable for improving process control in a semiconductor wafer fabrication process comprising:
    a metrology system configured to acquire a metrology signal from a metrology target of a wafer; and
    a computing system including one or more processors configured to execute program instructions stored in memory, the program instructions configured to cause the one or more processors to:
        determine a plurality of overlay estimates for the metrology target by applying a plurality of overlay algorithms to the acquired metrology measurement signal from the metrology target, wherein a first overlay estimate is determined for the metrology target with a first overlay algorithm of the plurality of overlay algorithms and an additional overlay estimate is determined for the metrology target with an additional overlay algorithm of the plurality of overlay algorithms, wherein the first overlay algorithm is different from the additional overlay algorithm;
        generate a statistical overlay estimate distribution based on the plurality of overlay estimates; and generate a quality metric for the metrology target based on a span of the generated statistical overlay estimate distribution, wherein the quality metric is indicative of variation of the overlay estimates as a function of the plurality of overlay algorithms applied to the metrology measurement signal acquired from the metrology target, the quality metric configured to be non-zero for an asymmetric overlay measurement signal acquired from the metrology target and is proportional to an asymmetry-induced overlay inaccuracy in the metrology measurement signal acquired from the metrology target.

18. The system of claim 17, wherein the computing system is further configured to identify one or more outlier metrology targets based on the generated quality metric and one or more additional generated quality metrics.

19. The system of claim 17, wherein the computing system is further configured to determine an optimum overlay measurement recipe utilizing the generated quality metric and one or more additional generated quality metrics.

20. The system of claim 17, wherein the computing system is further configured to generate one or more process tool correctables based on the generated quality metric and one or more additional generated quality metrics.

21. The system of claim 17, wherein the computing system is further configured to generate one or more sampling plans based on the generated quality metric and one or more additional generated quality metrics.

22. The system of claim 17, wherein the computing system is further configured to generate a process signature mapping database.

* * * * *